United States Patent
Bartley et al.

(10) Patent No.: US 8,445,918 B2
(45) Date of Patent: May 21, 2013

(54) THERMAL ENHANCEMENT FOR MULTI-LAYER SEMICONDUCTOR STACKS

(75) Inventors: Gerald K. Bartley, Rochester, MN (US); Russell Dean Hoover, Rochester, MN (US); Charles Luther Johnson, Tampa, FL (US); Steven Paul VanderWiel, Rosemount, MN (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 12/855,854

(22) Filed: Aug. 13, 2010

(65) Prior Publication Data

US 2012/0038057 A1   Feb. 16, 2012

(51) Int. Cl.
*H01L 31/0312* (2006.01)

(52) U.S. Cl.
USPC .................................. 257/77; 438/15

(58) Field of Classification Search
USPC .............................. 257/777, E21.528; 438/15
See application file for complete search history.

(56) References Cited

U.S. PATENT DOCUMENTS

| | | | |
|---|---|---|---|
| 7,649,386 B2 | 1/2010 | Ozguz et al. | |
| 7,701,252 B1 | 4/2010 | Chow et al. | |
| 7,930,661 B1 | 4/2011 | Trimberger et al. | |
| 7,973,555 B1 | 7/2011 | Trimberger et al. | |
| 2008/0150579 A1 | 6/2008 | Madurawe | |
| 2008/0224322 A1* | 9/2008 | Shinogi | 257/777 |
| 2008/0230923 A1 | 9/2008 | Jo et al. | |
| 2010/0047963 A1 | 2/2010 | Wang et al. | |
| 2010/0062565 A1 | 3/2010 | Martin et al. | |
| 2011/0193212 A1* | 8/2011 | Gu et al. | 257/686 |

OTHER PUBLICATIONS

U.S. Patent and Trademark Office, Office Action issued in related U.S. Appl. No. 12/911,879, dated Mar. 15, 2012.
U.S. Patent and Trademark Office, Office Action issued in related U.S. Appl. No. 12/431,259, dated Apr. 17, 2012.

* cited by examiner

*Primary Examiner* — Howard Weiss
*Assistant Examiner* — Steven Rao
(74) *Attorney, Agent, or Firm* — Wood, Herron & Evans LLP

(57) ABSTRACT

A circuit arrangement and method in one aspect utilize thermal-only through vias, extending between the opposing faces of stacked semiconductor dies, to increase the thermal conductivity of a multi-layer semiconductor stack. The thermal vias are provided in addition to data-carrying through vias, which communicate data signals between circuit layers, and power-carrying through vias, which are coupled to a power distribution network for the circuit layers, such that the thermal conductivity is increased above that which may be provided by the data-carrying and power-carrying through vias in the stack. A circuit arrangement and method in another aspect organize the circuit layers in a multi-layer semiconductor stack based upon current density so as to reduce power distribution losses in the stack.

18 Claims, 12 Drawing Sheets

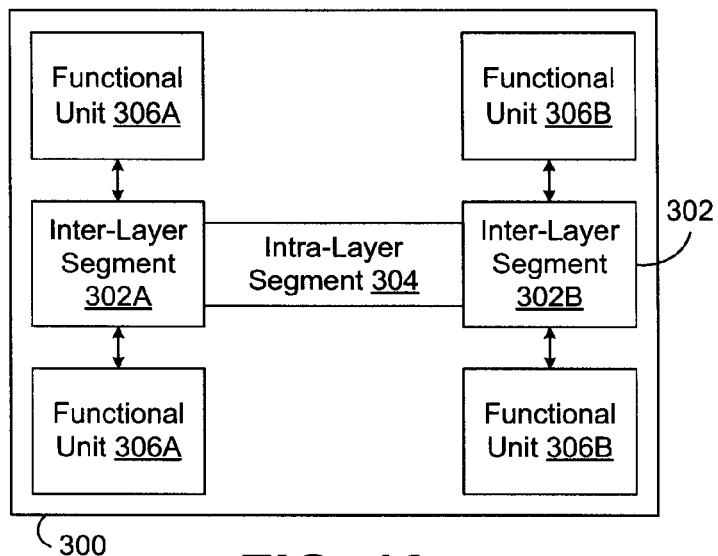
FIG. 12
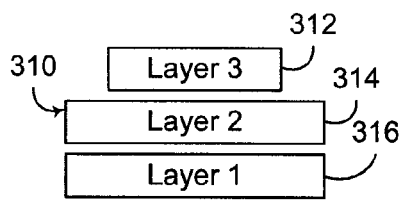
FIG. 13
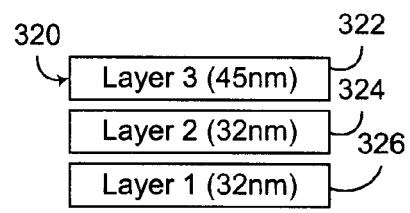
FIG. 14
FIG. 15
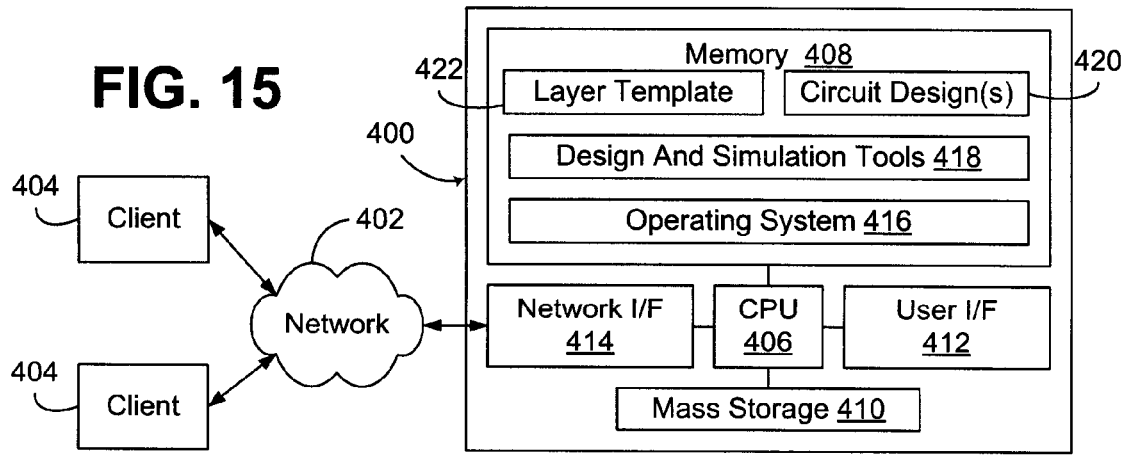

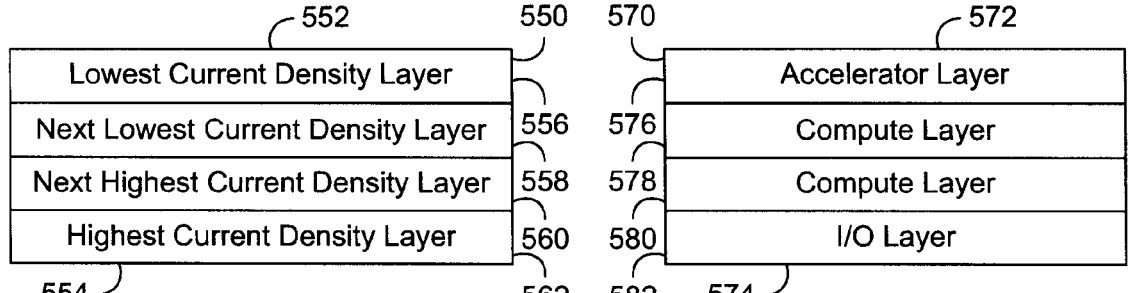
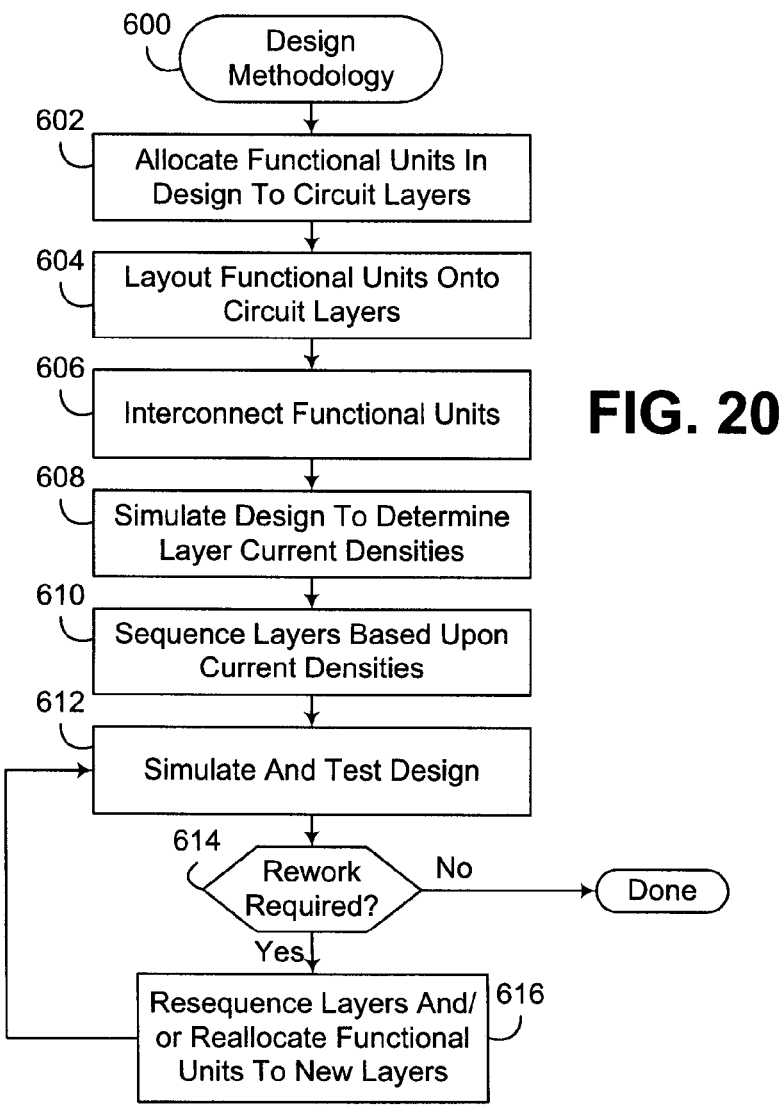

THERMAL ENHANCEMENT FOR MULTI-LAYER SEMICONDUCTOR STACKS

CROSS-REFERENCE TO RELATED APPLICATIONS

This application is related to U.S. patent application Ser. No. 12/431,259 filed on Apr. 28, 2009 by Bartley et al., which application is incorporated by reference herein.

FIELD OF THE INVENTION

The invention is generally related to interconnecting multiple semiconductor dies in a stack and the design of circuit logic therefor.

BACKGROUND OF THE INVENTION

As semiconductor technology continues to inch closer to practical limitations in terms of feature size, architects are increasingly focusing on alternative manners of meeting the demands for integrating increasingly complex circuitry onto semiconductor devices, or chips. In addition, as feature sizes decrease, and thus as faster and more complex circuits are integrated onto a given semiconductor chip, architects are finding that in many instances the communication of data between the various functional units on a semiconductor chip can become a bottleneck on overall performance. Communicating data between functional units disposed at opposite ends of a large semiconductor chip (e.g., a 300 or 500 mm$^2$ die size) often requires several clock cycles, as well as significant buffering logic on the chip. Furthermore, in general as the size and amount of circuitry integrated into a chip design increases, the yield of the manufacturing process typically decreases, thereby increasing the cost of the manufactured chips.

One proposed solution to address these limitations has been to physically and electrically couple together multiple semiconductor chips or dies into a stack arrangement. By doing so, individual chips that are smaller, less complex, and less expensive can be used in lieu of a single larger, more complex and more expensive chip, and often with comparable or better overall performance. In many instances, for example, it has been found that the vertical distance between circuit logic disposed in different layers of a multi-layer semiconductor stack may end up being shorter than the maximum horizontal distances within any given circuit layer, and as such, communicating data between circuit layers disposed on different chips may involve less latency than communicating data between distant points on the same chip. Some conventional stacking technologies, for example, are capable of separating circuit layers on adjacent dies in a stack by less than 100 um, which is an order of magnitude or more less than the maximum horizontal dimension of many dies (e.g., a 100 mm$^2$ die has a length and width of 10,000 um).

From a design standpoint, however, integrating circuits on multiple chips in a multi-layer semiconductor stack can be problematic. Laying out signal paths and electrical conductors to effectively interconnect circuits conventionally has required substantial design work, and opportunities for design reuse have been limited.

Another challenge for multi-layer semiconductor stacks is thermal dissipation. Conventionally, heat is dissipated from semiconductor chips through the use of heat sink arrangements that are mounted to the surfaces of chips to conduct heat away from the chips. With the circuit layers on such chips typically mounted in a face-down manner to electrically interconnect the circuit layers to circuit boards or packages, heat sinks are typically mounted to the opposite faces of such chips from that upon which circuit layers have been formed, requiring heat to be transferred through the silicon or other semiconductor substrates to the heat sinks.

With conventional single-layer semiconductor chips, and considering the relatively poor thermal conductivity of the semiconductor substrate, thermal dissipation is improved by maximizing the surface area of a chip that is contacted by a heat sink. However, with multi-layer semiconductor stacks, the same amount of logic circuitry, and thus the same amount of heat generating circuitry, can present a much smaller surface area to which a heat sink may be mounted. A four layer semiconductor stack, for example, including logic circuitry disposed over four circuit layers, would present one fourth of the surface area that would be presented were the same logic circuitry disposed in a single layer semiconductor chip. As a result, the four layer semiconductor stack would have roughly 4× the thermal density of a single layer chip.

Therefore, a significant need exists in the art for an improved manner of dissipating heat in a multi-layer semiconductor stack.

SUMMARY OF THE INVENTION

The invention addresses these and other problems associated with the prior art by providing a circuit arrangement and method that in one aspect utilize thermal-only through vias (also referred to herein as "thermal vias"), extending between the opposing faces of stacked semiconductor dies to increase the thermal conductivity of a multi-layer semiconductor stack. The thermal vias are provided in addition to data-carrying through vias, which communicate data signals between circuit layers, and power-carrying through vias, which are coupled to a power distribution network for the circuit layers, such that the thermal conductivity is increased above that which may be provided by the data-carrying and power-carrying through vias in the stack.

Therefore, consistent with one aspect of the invention, a circuit arrangement includes a plurality of semiconductor dies physically and electrically coupled to one another in a stack, with each semiconductor die including opposing faces, and where at least one face of each semiconductor die includes circuit logic integrated thereon and defining a circuit layer. The circuit arrangement also includes a regular array of conductive through vias disposed in each of the plurality of semiconductor dies, with the regular array of conductive through vias in each semiconductor die extending through such semiconductor die. A first subset of the conductive through vias are configured as data-carrying through vias that communicate data between the circuit layer on such semiconductor die and another circuit layer disposed on another semiconductor die in the stack, and a second subset of the conductive through vias are configured as power-carrying through vias that are coupled to a power distribution network for the circuit layer on such semiconductor die. A third subset of the conductive through vias are configured as thermal-only through vias that are non-data-carrying and non-power-carrying and that conduct thermal energy generated by the circuit layers within the stack.

The invention also addresses the aforementioned problems by providing a circuit arrangement and method that in another aspect organize the circuit layers in a multi-layer semiconductor stack based upon current density so as to reduce power distribution losses in the stack. In particular, embodiments consistent with the invention recognize that through improved thermal characteristics of semiconductor dies used in a multi-layer semiconductor stack relative to a conventional single layer semiconductor die, the arrangement of circuit layers may be selected to optimize power distribution losses and thereby minimize IR drops and effective DC resistance in a stack.

Therefore, consistent with another aspect of the invention, a circuit arrangement includes a plurality of semiconductor dies physically and electrically coupled to one another in a stack, with each semiconductor die including opposing faces, where at least one face of each semiconductor die includes circuit logic integrated thereon and defining a circuit layer that includes at least one functional unit, where at least one face of each semiconductor die includes an inter-layer interface region disposed thereon, and where each inter-layer interface region on each semiconductor die is disposed at substantially the same topographic location when the respective semiconductor die is disposed within the stack. The circuit arrangement also includes an inter-layer bus electrically coupling the functional units on the plurality of semiconductor dies to one another, with the inter-layer bus comprising a plurality of electrical conductors disposed within the inter-layer interface region of each semiconductor die and extending between the opposing faces of each semiconductor die, where respective electrical conductors disposed in the inter-layer interface regions of adjacent semiconductor dies in the stack are electrically coupled to one another when the plurality of circuit layers are physically and electrically coupled to one another in the stack, where the stack includes bottom and top opposing faces respectively defined on bottom and top semiconductor dies from among the plurality of semiconductor dies, where the bottom face is configured to mount the stack to a substrate, and where the top face is configured to interface with a heat sink, and where the plurality of semiconductor dies are arranged in the stack such that a first semiconductor die having a higher current density than a second semiconductor die is disposed closer to the bottom face of the stack than the second semiconductor die to reduce power distribution losses in the stack.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIG. 12 is a block diagram of another multi-layer semiconductor stack implementation, illustrating the use of multiple bus segments for an inter-layer bus consistent with the invention.

FIG. 13 is a block diagram of yet another multi-layer semiconductor stack implementation, illustrating the use of differently-sized semiconductor dies.

FIG. 14 is a block diagram of still another multi-layer semiconductor stack implementation, illustrating the use of semiconductor dies incorporating different semiconductor fabrication design rules.

FIG. 15 is a block diagram of a computer system suitable for designing a multi-layer semiconductor stack implementation in a manner consistent with the invention.

FIG. 18 is a block diagram a multi-layer semiconductor stack implementation, illustrating sequencing of semiconductor dies based upon current density.

FIG. 19 is a block diagram another multi-layer semiconductor stack implementation, also illustrating sequencing of semiconductor dies based upon current density.

FIG. 20 is a flowchart illustrating steps in a design methodology for designing a multi-layer semiconductor stack and incorporating sequencing of semiconductor dies based upon current density.

DETAILED DESCRIPTION

Embodiments consistent with the invention may incorporate techniques consistent with the invention to enhance the thermal characteristics of a multi-layer semiconductor stack. One technique that may be employed utilizes thermal-only through vias (hereinafter referred to as "thermal vias") to improve the thermal conductivity of a multi-layer semiconductor stack. Another technique, which may be used in connection with or in lieu of thermal vias, sequences or arranges semiconductor dies, and the circuit layers disposed thereon, in a stack so as to minimize power distribution losses in the stack.

Prior to discussing the aforementioned thermal enhancement techniques, however, an overview of one implementation of a multi-layer semiconductor stack and the design thereof, suitable for use in connection with such thermal enhancement techniques, is provided.

Multi-Layer Semiconductor Stack with Inter-Layer Bus

Embodiments of the invention may be utilized in connection with a universal, standardized inter-layer bus, which, as disclosed in the aforementioned cross-referenced patent application, facilitates communication between functional units disposed in different circuit layers of a multi-layer semiconductor stack. In this regard, an individual circuit layer may be considered to include a two dimensional layout of logic circuitry disposed on a semiconductor substrate. It will be appreciated that, a single circuit layer may include multiple physical layers (e.g., metal layers, dielectric layers, etc.) as a result of fabrication processes, but that these multiple layers collectively define a logic circuit that is essentially laid out across a two dimensional footprint. A multi-layer semiconductor stack therefore includes multiple circuit layers interconnected with one another in an overlapping relationship to effectively define a three dimensional circuit design, adding a vertical or transverse dimension to planar dimensions of the individual circuit layers, and utilizing an inter-layer bus to communicate along the vertical direction between functional units defined within the individual circuit layers.

Figure 1:
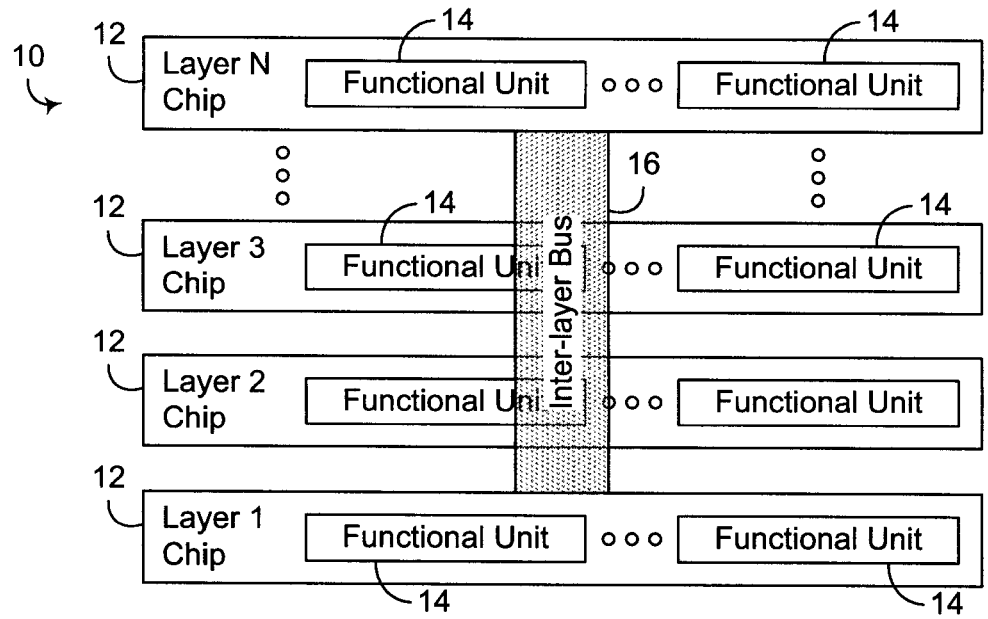
FIG. 1 is a block diagram of a multi-layer semiconductor stack incorporating an inter-layer bus consistent with the invention.

FIG. 1, for example, illustrates a multi-layer semiconductor stack 10 incorporating a plurality of semiconductor dies or chips 12, each including one or more functional units 14. Consistent with the invention, the functional units 14 on the plurality of chips 12 communicate with one another over a vertically or transversely oriented inter-layer bus 16, and are physically and electrically coupled to one another in a stacked arrangement.

Figure 2:
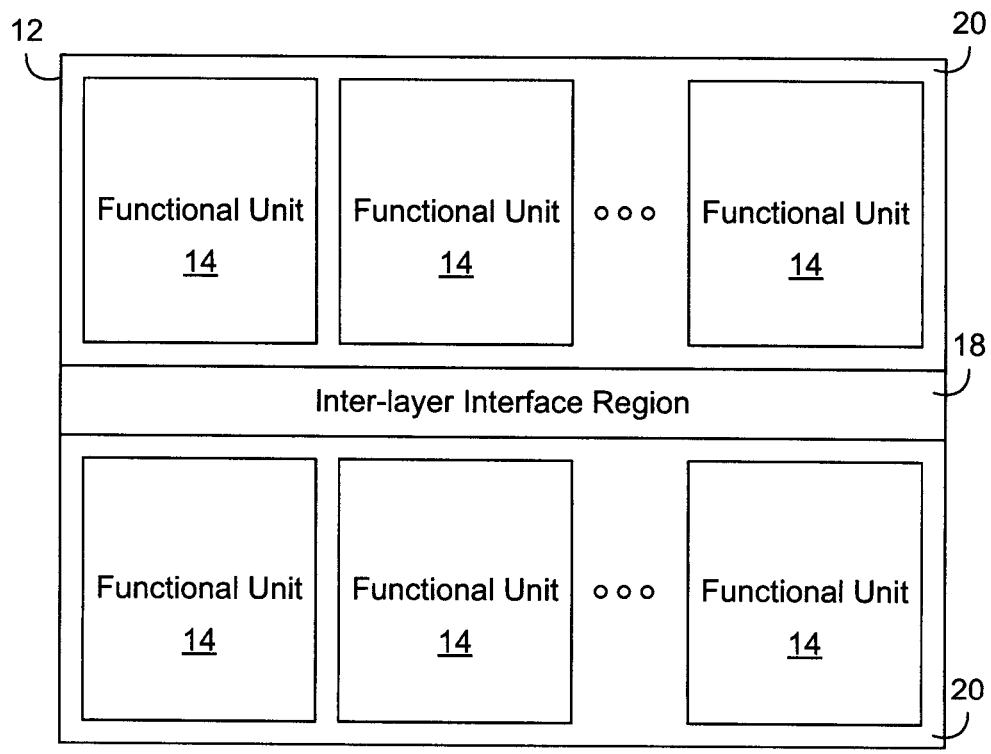
FIG. 2 is a block diagram of an exemplary circuit layer from the multi-layer semiconductor stack of FIG. 1.

As shown in FIG. 2, to implement a universal, standardized inter-layer bus, each semiconductor die 12 includes an inter-layer interface region 18 disposed at a predetermined topographic location of the die, which includes a plurality of electrical conductors (not shown in FIG. 2) disposed at predetermined locations such that, when the dies 12 are stacked together, the respective inter-layer interface regions 18, and thus the electrical conductors therein, are topographically aligned with one another (within the context of the invention, and assuming an x-y-z coordinate system where x and y refer to dimensions within the plane of a circuit and z refers a dimension perpendicular to the plane of the circuit, two features are topographically aligned when those features have substantially the same x, y coordinates when the dies upon which those features are formed are arranged together in a stack.) In many instances, due to this alignment, the interconnection of the electrical conductors within the individual dies to one another to form the inter-layer bus is an automatic occurrence resulting from the physical and electrical interconnection of the dies to one another into the stack.

It will be appreciated that an inter-layer interface region may take a number of forms depending upon factors such as the number of bus segments required, the number of interconnects required to implement the bus, the number and arrangement of functional units, and the size of the respective dies. For example, if a stack includes dies of varying sizes, the inter-layer interface regions on different dies may be differently-sized, but may nonetheless include corresponding and topographically aligned electrical conductors to implement the bus. Also, an interface region may be a single contiguous region or may be broken into multiple non-contiguous regions. Furthermore, as discussed below in connection with FIG. 8, some circuit layers in a stack may include intra-layer bus interconnections, e.g., to interconnect multiple bus segments of an inter-layer bus, such that the inter-layer interface region of one circuit layer may be a superset or subset of the inter-layer interface region of another layer.

In the illustrated embodiments, functional circuitry for a circuit layer, e.g., the functional units 14 in a circuit design, may not be placed within the inter-layer interface region, but are instead required to be placed in a functional region 20 of the die. A functional unit, in the context of the invention, generally refers to functionally-related logic circuitry that has been partitioned for functional purposes into a distinct unit. While in the illustrated embodiments, functional units are typically highly complex circuits such as processor cores, memory controllers, or accelerator units, it will be appreciated that in other embodiments, the complexity and functionality of a functional unit may be more or less complex, and that an inter-layer bus consistent with the invention may be used to enable communication of data between practically any type of logic circuitry that may be integrated into a circuit design.

Figure 3:
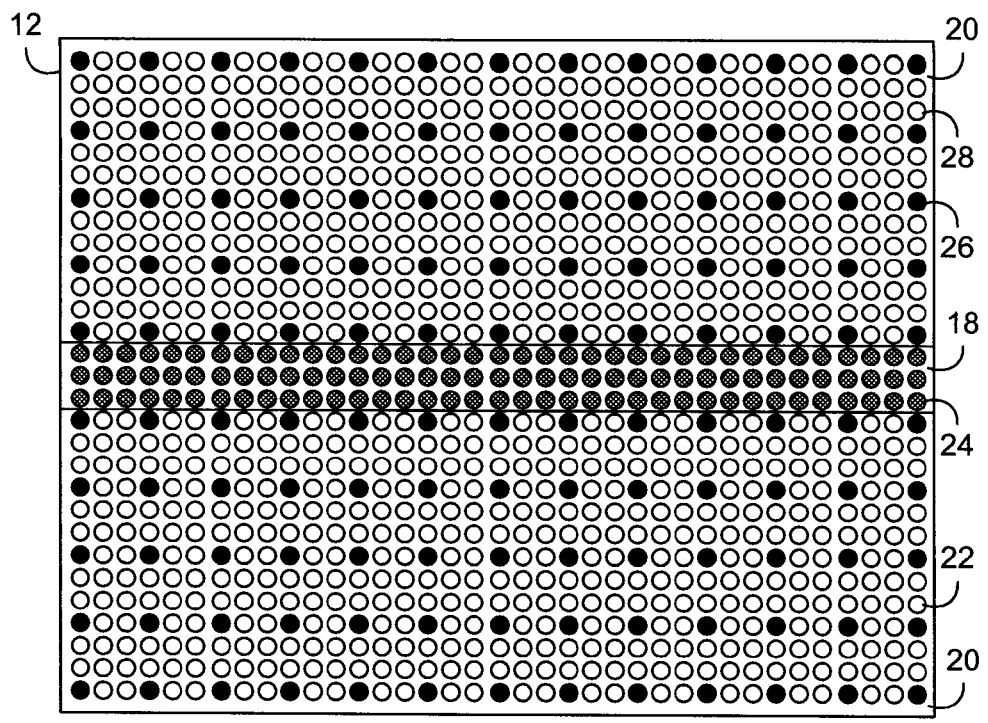
FIG. 3 is a block diagram illustrating an exemplary contact pad array for a semiconductor die in the multi-layer semiconductor stack of FIG. 1.

Turning now to FIG. 3, while not mandatory, it is typically desirable to lay out the electrical conductors in an inter-layer bus in a regular pattern that is repeatable among all circuit layers of a multi-layer semiconductor stack. In the illustrated embodiment, for example, it may be desirable to arrange the electrical conductors into a regular two dimensional array such as a rectangular array, and moreover, to integrate such an array with an array of power distribution electrical conductors that operate as the power distribution network for each semiconductor die.

FIG. 3, for example, illustrates a rectangular array of contact pads 22 disposed over the surface of a semiconductor die 12. The gray pads 24, disposed within inter-layer interface region 18, are coupled to electrical conductors for the inter-layer bus, while the black pads 26 are power distribution pads coupled to either positive voltage (VDD) or ground. The white pads 22 are dummy pads, and are electrically isolated from any active circuitry. The dummy pads, however, serve as additional mechanical connections to which adjacent semiconductor dies can be secured.

In this embodiment, the pitch of the inter-layer bus pads 24 is three times that of the power distribution pads 26, whereby within any 3×3 grid of pads in the inter-layer interface region 18 there will be nine inter-layer bus pads 24, but within any 3×3 grid of pads in the functional region 20 there will be one power distribution pad 26 and eight dummy pads 28.

In one embodiment, for example, the pitch of the inter-layer bus pads in 50 um while that of the power distribution pads is 150 um, which is compatible, for example, with conventional micro C4 bonding techniques. On, for example, a semiconductor die having contact pads distributed over a 210 mm$^2$ (18.6 mm×11.3 mm) area, an array of 84,072 (226×372) contact pads may be provided. An inter-layer interface region configured in the manner illustrated in FIG. 3, and having a size of about 18.6 mm×0.55 mm (or a width equivalent to 11 rows of contact pads) would occupy less than 5% of the available space on the die, and would provide 4092 separate signal paths.

It will be appreciated that power distribution pads may also be disposed within inter-layer interface region in some embodiments, and that in other embodiments, some positive voltage and ground electrical conductors may be considered part of the inter-layer bus architecture, and therefore be present within the inter-layer interface region for that reason. It will further be appreciated that the distribution of positive voltage and ground contact pads may vary in different embodiments, e.g., with more or less positive voltage contact pads than ground pads, or with the power distribution pads distributed throughout the functional region in an irregular distribution pattern.

Figure 4:
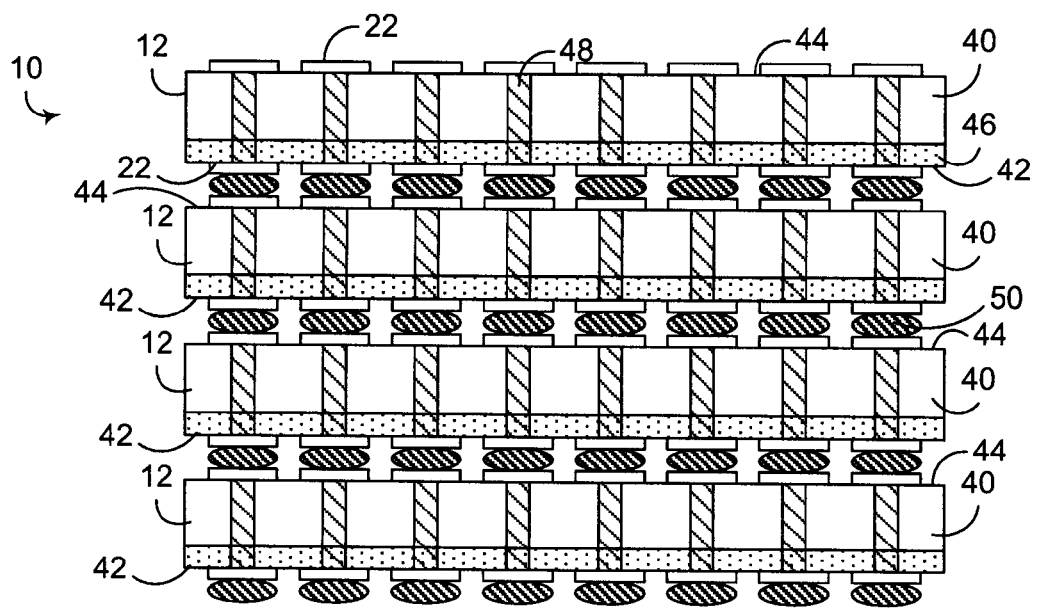
FIG. 4 is a functional cross-sectional view of the multi-layer semiconductor stack of FIG. 1.

As illustrated in FIG. 4 (which is not shown to scale), in one implementation, the semiconductor dies 12 in multi-layer semiconductor stack 10 are physically and electrically coupled to one another in a stack arrangement. Each die 12 includes a substrate 40 (e.g., a silicon substrate), and each die includes opposing surfaces or faces 42, 44, and at least one of which includes circuit logic 46 integrated thereon and defining a circuit layer for the multi-layer stack. The various manners in which integrated circuit logic may be fabricated on a surface of substrate 40 are well known to those of ordinary skill having the benefit of the instant disclosure, and therefore will not be discussed in greater detail herein.

To physically and electrically couple the semiconductor dies 12 together, and thereby join the electrical conductors for the inter-layer bus, various techniques may be used. For example, in one embodiment, each semiconductor die is fabricated on a silicon wafer of conventional thickness (e.g., about 700 um thick). The side of the wafer opposite that upon which the circuit logic is then ground and polished, e.g., to about 50 to about 70 um in thickness. A regular array of holes (e.g., at the same pitch as the regular array of contact pads, in this implementation 50 um) are formed in each die extending completely between surfaces 42, 44 (e.g., via ion etching) and a conductive material is deposited on the walls of the holes. The holes are then filled with silicon to form through silicon vias (TSV's) 48. Topographically aligned regular arrays of contact pads 22 are then formed on the opposing surfaces 42, 44 of each die 12, with the topographically aligned contact pads 22 on the opposing surfaces 42, 44 electrically coupled to one another by a respective via 48 extending between such pads 22.

It will be appreciated that TSV's may extend completely through each die 12, or some or all of the TSV's may be discontinuous through the thickness of each die. For example, in some embodiments, it may be desirable for any TSV's associated with Vdd/Gnd to extend completely through the thickness of the die, and for any TSV's associated with data-carrying signals, the data signals may enter the bottom of a single circuit layer via a contact pad 22, connect to a circuit in the circuit layer, and have the output of that circuit routed to the same topographic location and coupled to a TSV extending through the substrate of the die to the opposing contact pad 22.

In the illustrated embodiment, it is desirable to not form vias in each die that are topographically aligned with any dummy contact pads on the die. Thus, for example, it may be desirable to form a regular array of vias at the pitch of the inter-layer bus electrical conductors within the inter-layer interface region 18 of each die (in this embodiment, 50 um), but form a regular array of vias at the pitch of the power distribution conductors in the functional region 20 (in this embodiment, 150 um). By doing so, the area in the functional region of the active circuit layer that would otherwise be occupied by vias is available for functional circuitry.

Once the contact pads are formed on the opposing surfaces of the semiconductor dies 12, the dies 12 may be separated from the wafer and physically and electrically coupled to one another in a stacked arrangement using any of a number of different types of chip bonding techniques, e.g., compression soldering or micro C4 (Controlled Collapse Chip Connection), resulting in the formation of a regular array of physical/electrical interconnects 50 joining contact pads 22 on adjacent surfaces 42, 44 of adjacent semiconductor chips 12. Additional manufacturing steps, e.g., mounting the stack 10 to a carrier or package, applying thermal grease, attaching a heat sink, encapsulating the stack, etc. may also be performed to complete the assembly.

While each semiconductor die 12 is illustrated as including contact pads on both surfaces, with a single circuit layer deposed on one of the surfaces, and with all dies oriented such that the active layer of each die faces downward, it will be appreciated that alternative arrangements may be used in other embodiments. For example, different die interconnection technologies can be used for different dies within the same stack, and dies disposed at the top or bottom of a stack may be configured differently from other dies in the stack. As an example, an end (or top) die in a stack may not include vias, and may simply include contact pads coupled directly to the active circuitry on the single face of the die. In many embodiments, it is desirable, however, for the end dies to include vias and contact pads on the opposite face from the active circuitry, as the conductive material in the vias may operate in much the same manner as a heat pipe, given that the conductive vias and contact pads are topographically aligned through the entire thickness of the stack.

As another example, active circuitry may be integrated onto both surfaces of a semiconductor die, or a dual sided semiconductor die may be formed by wafer bonding two semiconductor substrates together either face to face or back to back. As yet another example, alternate dies in a stack may be flipped to orient the active circuitry on particular semiconductor dies either closer or farther away from the active circuitry on adjacent semiconductor dies.

It will also be appreciated that a number of alternate fabrication, packaging, and manufacturing techniques, which are either currently known or which may hereinafter be developed, may be utilized to manufacture a multi-layer semiconductor stack consistent with the invention. The invention is therefore not limited to the particular techniques described herein.

Figure 5:
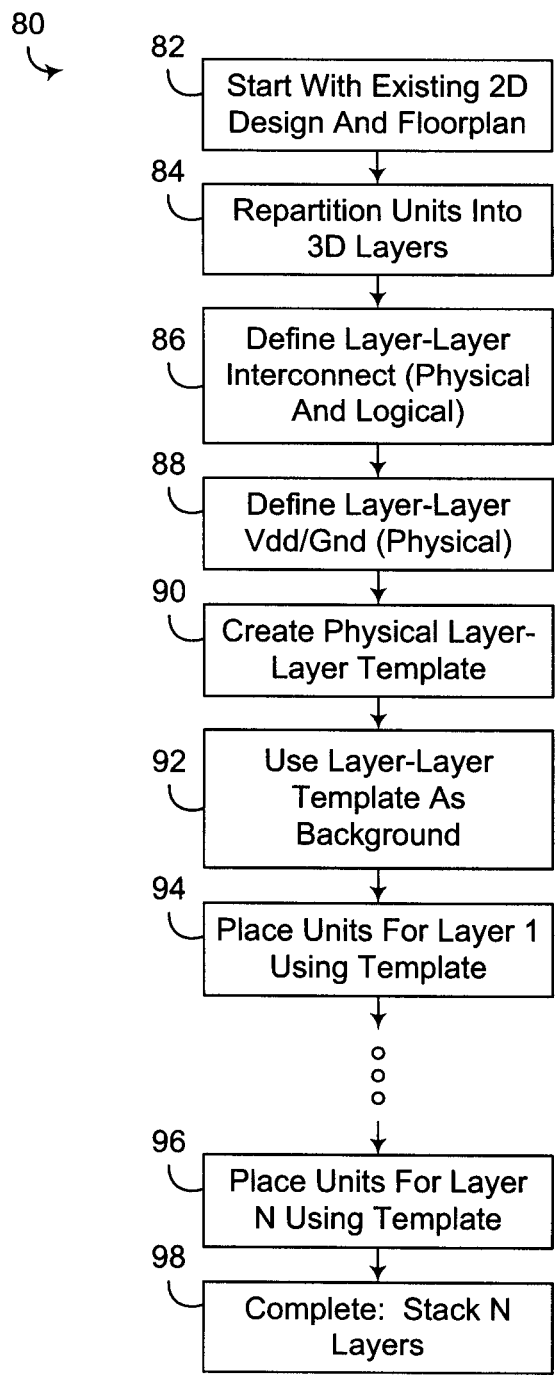
FIG. 5 is a flowchart illustrating a process for redesigning a single circuit layer design for implementation in a multi-layer semiconductor stack in a manner consistent with the invention.

FIG. 5 next illustrates an exemplary design process 80 that may be utilized to design a circuit arrangement for a multi-layer semiconductor stack in a manner consistent with the invention. In this implementation, an existing single circuit layer design, also referred to herein as a two dimensional design, is redesigned or adapted into a three dimensional design suitable for implementation in a multi-layer semiconductor stack. It will be appreciated, however, that other design methodologies may be employed, and that the design of three dimensional or multi-layer semiconductor stack designs need not be based upon preexisting two dimensional designs. The invention is therefore not limited to the particular design methodology utilized herein.

Process 80 begins in block 82 by starting with an existing two dimensional design and general floorplan. The circuit logic in a design typically is organized into multiple functional units, where each functional unit includes circuit logic that is functionally related toward performing a common computational task. Additional support circuitry that may not have any particular high level task, but that is otherwise required for the operation of the design, may also be considered to be organized into a functional unit for the purposes of process 80, and it may be desirable to group together circuit logic that is otherwise unrelated but capable of being laid out in the same general region as a functional unit to facilitate the redesign process. In the example described below, for example, it may be desirable to group together much of the circuitry that is otherwise not dedicated to a particular processing core or accelerator unit to one or more I/O functional units that handle ancillary tasks such as external drivers and interfaces, networking, testing, debugging, clock and/or power distribution, memory control, etc.

Next, in block 84, the functional units in the single circuit layer, two dimensional design are repartitioned into N circuit layers. While various alternative methodologies may be used, it is typically desirable to group together functionally-related functional units on the same circuit layer. Moreover, in situations where multiple instances of a given functional unit are present in a design, it may be desirable to locate all of those instances on the same circuit layers. For example, in design incorporating multiple processing cores, it may be desirable to allocate those processing cores to the same layers.

Next, in block 86, the inter-layer interconnect or bus is defined, both from a physical and logical standpoint. Specifically, the dimensions and location of the inter-layer interface region on each circuit layer, as well as the specific locations of the vias and electrical conductors for the bus within that region, are determined. Similarly, in block 88, the layer-layer power distribution network (Vdd/Gnd) is determined, thereby designating the locations of the positive voltage and ground vias.

Next, in block 90, a physical layer-layer template is created, using the inter-layer bus electrical conductor locations and power distribution network locations to block out the appropriate regions for the vias and provide contact points to which logic circuitry on each circuit layer can be electrically coupled. In addition, the template may be provided with standardized bus interface logic to facilitate interconnection of functional unit circuitry to the inter-layer bus.

Next, as illustrated in blocks 92-96, the created template may then be used as a background for each circuit layer in the multi-layer design, by placing the functional units allocated to those layers in the respective layer designs and coupling those functional units to the inter-layer bus and power distribution network defined by the background template. As shown in block 98, once each layer is designed, the N layers may be stacked for the purposes of testing and simulation, and the design is then suitable for fabrication and manufacture.

Typically, the placement of functional units in the circuit layer designs, as well as the interconnection of functional units to the signal paths of the inter-layer bus, are performed by software-based circuit design tools responsive to user input from a circuit designer. The design process results in the generation of one or more design files, from which a design may be tested, simulated, debugged and ultimately used during a fabrication process to manufacture multi-layer semiconductor stacks consistent with the invention.

Figure 6:
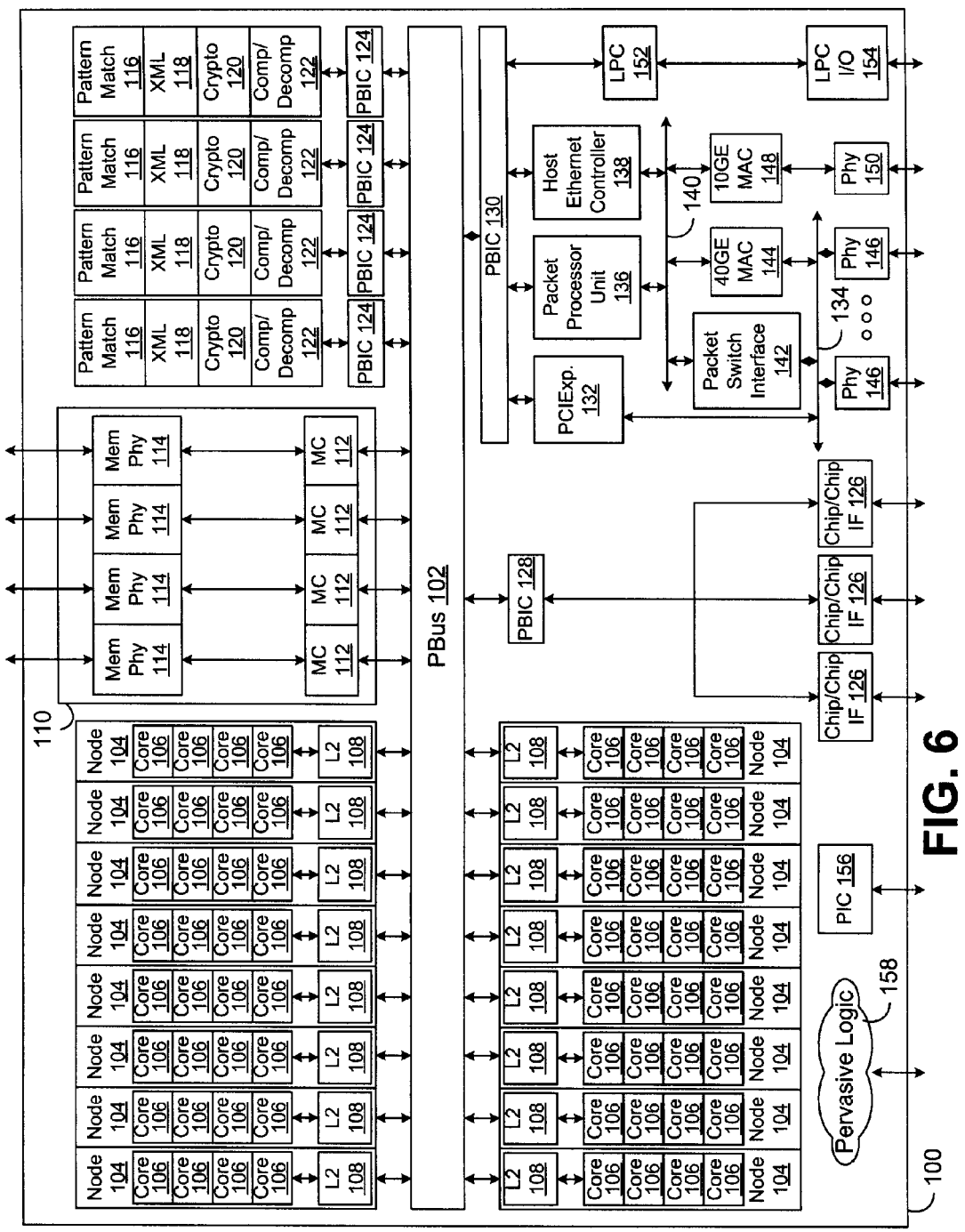
FIG. 6 is a block diagram illustrating an exemplary single circuit layer design capable of being redesigned by the process of FIG. 5.

FIGS. 6-11 further illustrate by way of example the process illustrated in FIG. 5. FIG. 6, in particular, illustrates an exemplary two dimensional design 100 for a multi-core networking device. Design 100 includes a system bus 102 to which a plurality of functional units are coupled to one another, as well as to other support and interface logic in the design. System bus 102 may be implemented, for example, using the PowerBus or PBus bus architecture used in connection with the Power processor architecture available from International Business Machines Corporation, among others.

Design 100 includes a plurality (e.g., 16) of nodes 104, with each node 104 including a plurality (e.g., four) of processing cores 106 coupled to a shared L2 cache 108. Each processing core 106, for example, may be implemented as a Power architecture compatible core.

Design 100 also includes memory controller logic 110 including a plurality (e.g., four) of memory controller blocks 112, each having a cooperative physical memory interface block 114 for coupling to off-chip memory. Design 100 also includes a set of accelerator blocks providing specialized logic for accelerating various functions required in the design, e.g., pattern matching (blocks 116), XML processing (blocks 118), cryptography (blocks 120) and compression/decompression (blocks 122). The accelerator blocks 116-122 are grouped into four groups, with each group interfaced with system bus 102 with an associated bus interface logic (PBIC) block 124.

Three chip/chip interface blocks 126 provide chip-to-chip communication, and are coupled to the system bus 102 by an associated PBIC block 128, while another PBIC block 130 couples a number of additional networking and interface logic blocks to system bus 102. Specifically a PCI Express block 132 couples to an on-chip PCI bus 134, while a packet processor unit 136 and host Ethernet controller block 138 are coupled to an on-chip bus 140. A packet switch interface block 142 and 40 Gigabit Ethernet Media Access Control block 144 are coupled between buses 134 and 140, and multiple physical interface blocks 146 are coupled to bus 134 to communicate with external (off-chip) devices. A 10 Gigabit Ethernet Media Access Control block 148 is also coupled to bus 134 and interfaced off-chip by a physical interface block 150. A low pin count (LPC) block 152 is also interfaced with system bus 102 via PBIC 130, and is coupled to an LPC 10 block 154. Additional circuit logic, e.g., a programmable interrupt controller (PIC) block 156 and pervasive logic 158, among additional support logic that is not otherwise illustrated in FIG. 6, may also be included in circuit design 100. Pervasive logic 158 may include, for example, JTAG, performance monitor, clock controller, POR and error control logic.

Figure 7:
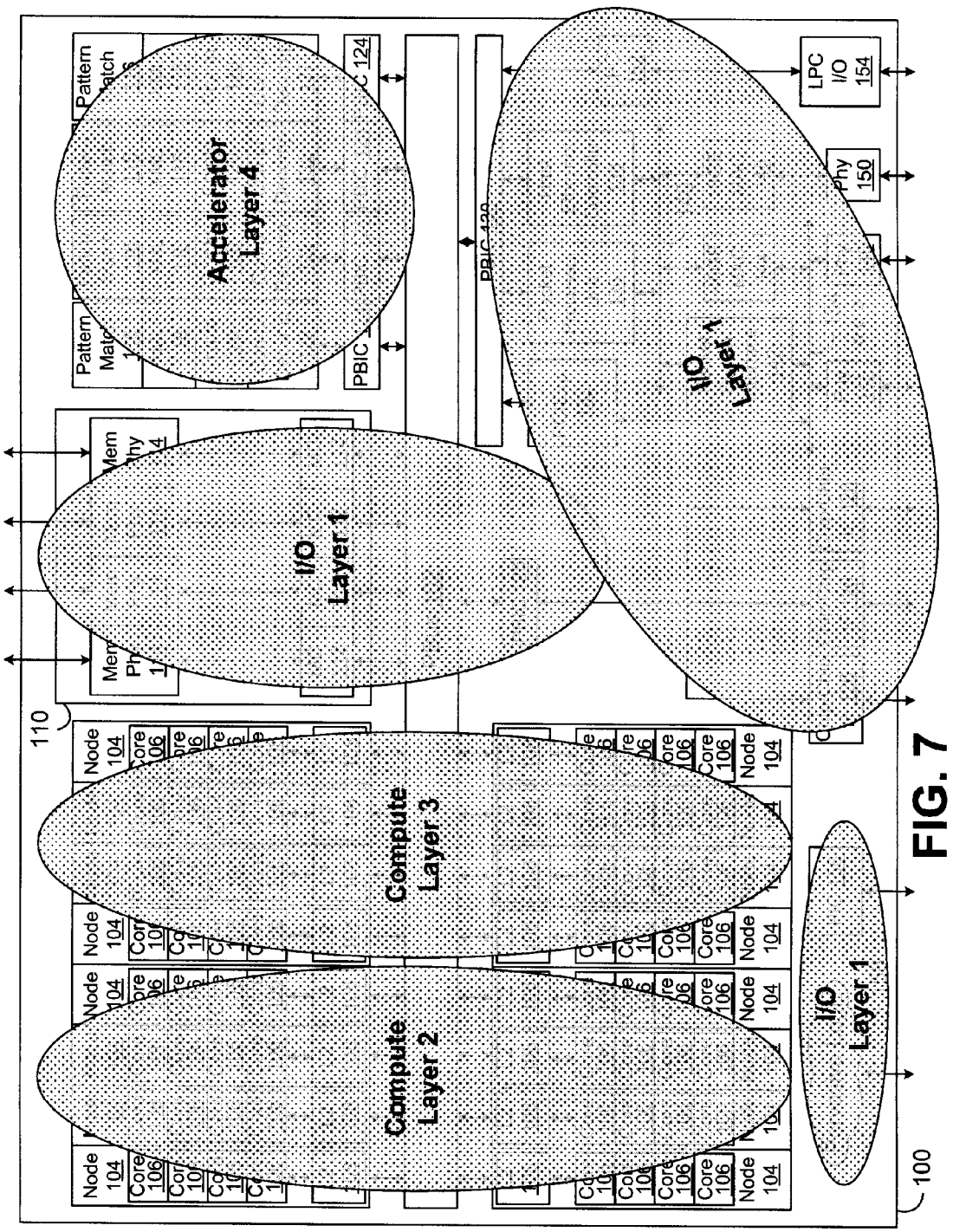
FIG. 7 is a block diagram of the single circuit layer design of FIG. 6, illustrating the mapping of functional units in the single circuit layer design to multiple circuit layers.

To redesign circuit design 100 for use in a multi-layer semiconductor stack, functional units in design 100 are repartitioned into multiple circuit layers, as described above in connection with block 84 of FIG. 5. FIG. 7, for example, illustrates the partitioning of functional units in circuit design 100 into four circuit layers. In this example, a first layer, designated I/O Layer 1, is used for memory controllers, network and interface logic, pervasive logic and other support logic, including any other logic required to implement off-chip communications. The sixteen processing nodes 104 (incorporating a total of 64 processing cores) are allocated to two compute layers, designated as Compute Layers 2 and 3, and the accelerator blocks 116-122 are allocated to a separate accelerator layer, designated Accelerator Layer 4, resulting in a total of four separate circuit layers.

Figure 8:
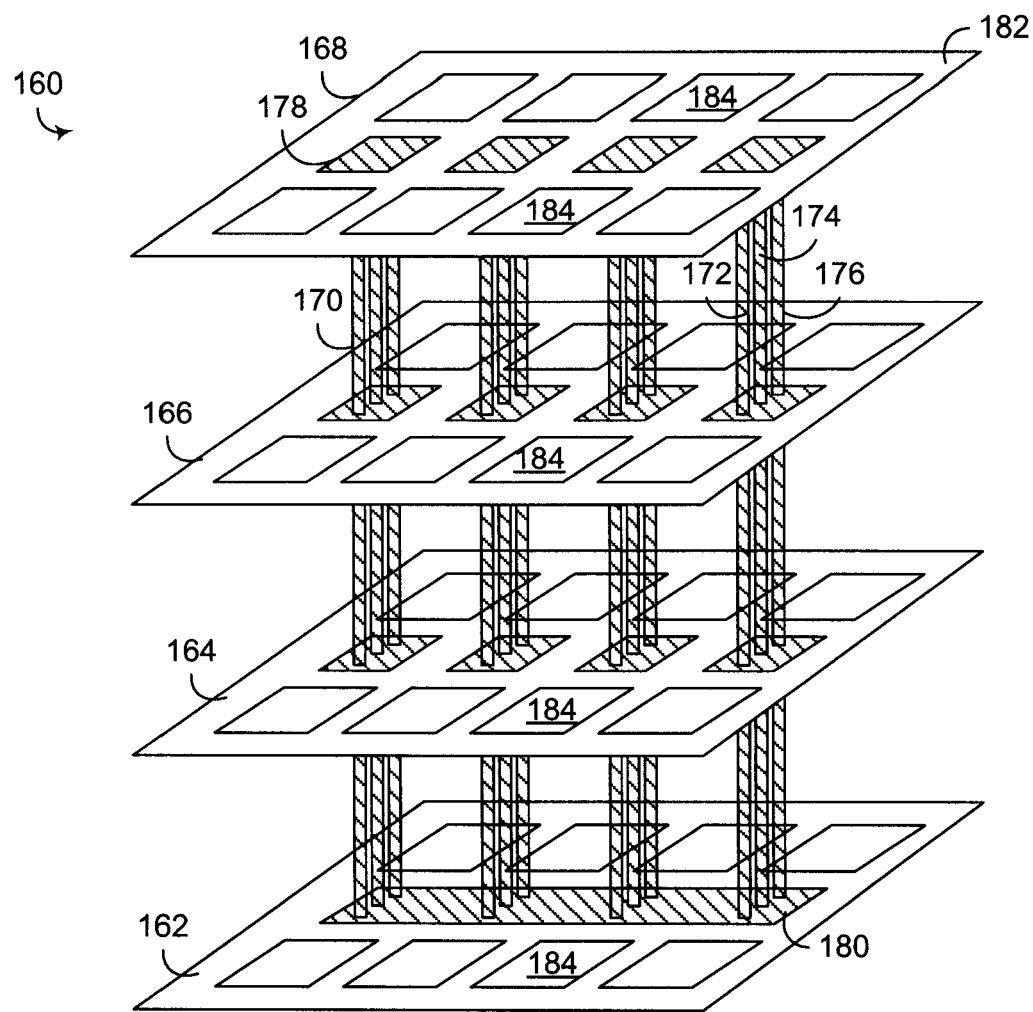
FIG. 8 is a functional exploded perspective view of a multi-layer semiconductor stack implementation of the single circuit layer design of FIG. 6.

Next, as described above in connection with block 86 of FIG. 5, the layer-layer or inter-layer interconnect is defined. For example, FIG. 8 illustrates an exemplary multi-layer circuit design 160 including four layers 162, 164, 166 and 168, respectively corresponding to I/O Layer 1, Compute Layer 2, Compute Layer 3 and Accelerator Layer 4.

In this implementation, the inter-layer bus 170 is defined with four segments. In this implementation, a PowerBus architecture compatible bus is used, which includes separate command and data buses (illustrated at 172 and 174) and pervasive interconnects (illustrated at 176). In one embodiment, for example, a PowerBus data bus may include 2560 signal paths providing an 8×32B wide data bus and 210 signal paths providing a command bus (including 46 address bits, 17 Ttag bits, 6 Ttype bits, 7 Tsize bits, 10 snoop bits, 40 combined response bits). An additional 40 to 80 signal paths may be used to provide pervasive signal paths, e.g., LBIST channels, an ABIST interface, trace and performance monitor signal paths, power on reset signal paths, error status signal paths, interrupt signal paths, clock control paths, local clock buffer (LCB) signal paths, etc. It will be appreciated, however, that the allocation of signal paths and interconnects to an inter-layer bus may vary in different embodiments, so the invention is not limited to the particular allocation described herein.

In this implementation, the partitioning of functional units to layers in the multi-layer design is used to implement a plurality of vertically-oriented "supernodes" or slices that are independently operating from one another, though distributed across the same layers of the design. In particular, four supernodes are defined, each including four compute nodes, two of which in each compute layer 164, 166, and a dedicated set of accelerator blocks in accelerator layer 168. The respective bus segments in inter-layer bus 170 are dedicated to each supernode, and as a result, four separate inter-layer interface regions 178 are defined on each of layers 164, 166 and 168. The supernodes, however, share I/O resources on layer 162, as well as communicate with one another via an intra-layer bus interconnected the bus segments, and as a result, the inter-layer interface region 180 of layer 162 may be shared and additionally include logic to logically join the respective bus segments to one another. The regions outside of the respective inter-layer interface regions 178, 180 of layers 162-168 are functional regions 182, within which functional units, generically represented at 184, may be placed.

Figure 9:
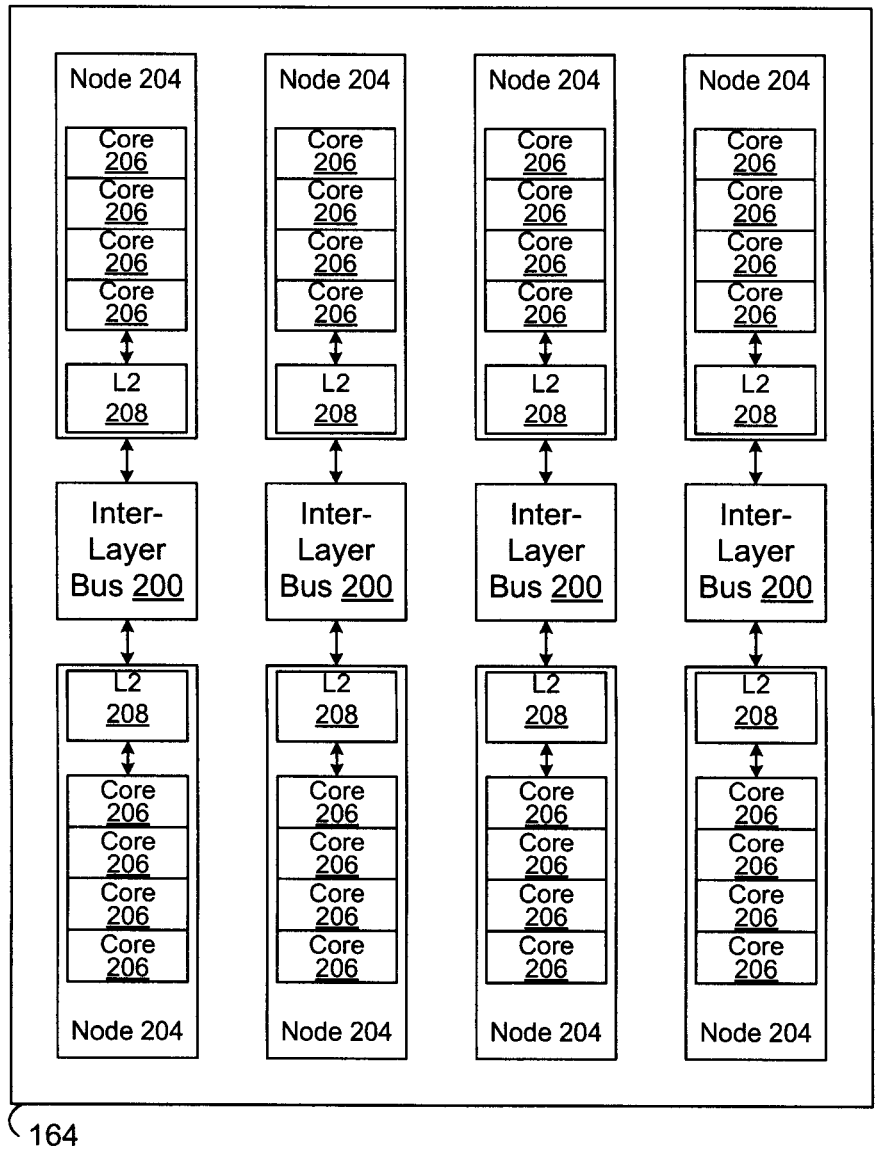
FIG. 9 is a block diagram of a compute circuit layer from the multi-layer semiconductor stack of FIG. 8.

Once the layer-layer interconnect has been defined, as described above in connection with FIG. 5, a template is created and used as a background for the design of the individual circuit layers. In the implementation of FIGS. 8-11, two separate templates are used, a first for the compute and accelerator layers 164, 168 (since these layers include four separate bus segments) and a second for the I/O layer 162 (since the four bus segments are effectively joined in this layer). FIG. 9, for example, illustrates one suitable layout for compute layer 164 is illustrated, which may also be suitable for compute layer 166 as well. In FIG. 9, as well as in FIGS. 10-11, it will be appreciated that the blocks or functional units numbered 2xx typically correspond to the blocks or functional units numbered 1xx in the two dimensional circuit design of FIG. 6, and that in many instances, the blocks or functional units from the two dimensional design may simply be reused in the three dimensional multi-layer semiconductor stack design.

In this layout, each supernode includes two compute nodes 204, each with four processing cores 206 and a shared L2 cache 208, and coupled to inter-layer bus logic 200 for the associated bus segment for the supernode. It will be appreciated that with two compute layers configured in the manner illustrated in FIG. 9, each supernode will have a total of four compute nodes 204 allocated thereto.

Figure 10:
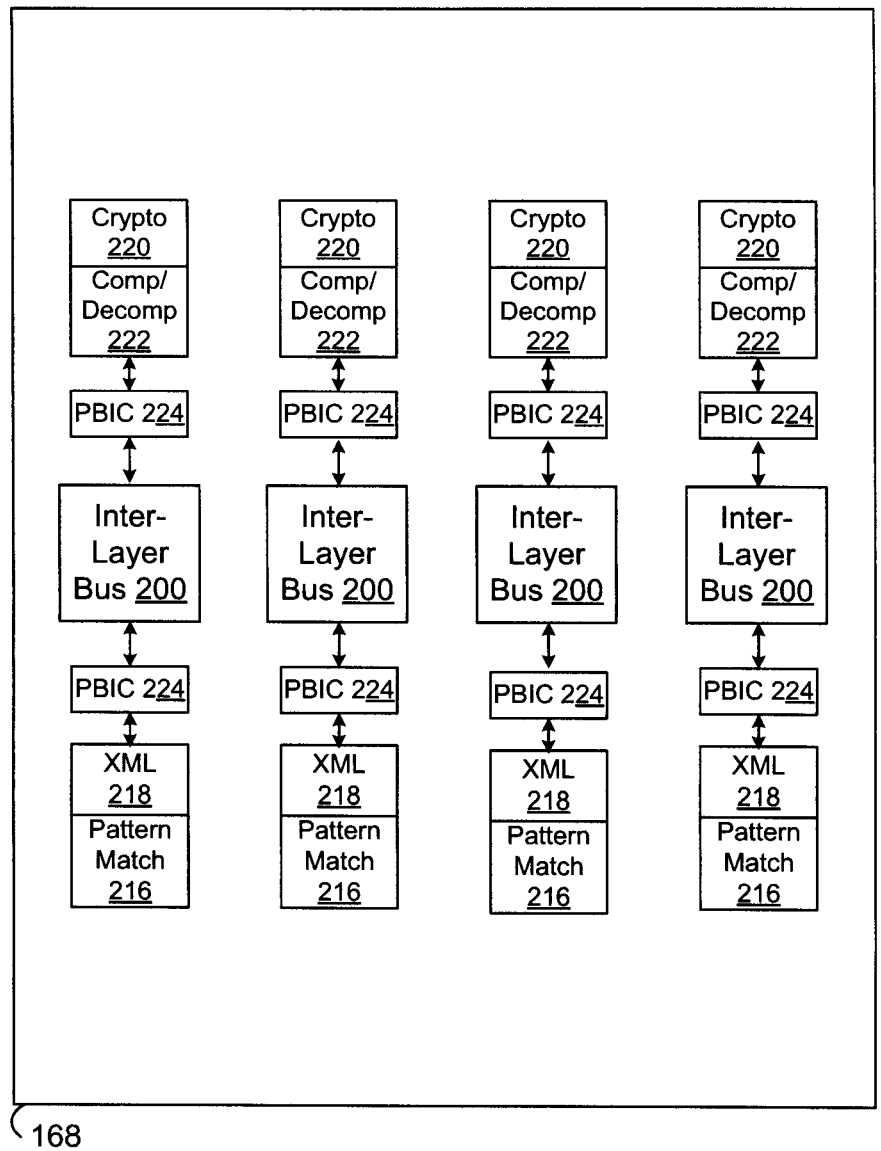
FIG. 10 is a block diagram of an accelerator circuit layer from the multi-layer semiconductor stack of FIG. 8.

FIG. 10 illustrates one suitable implementation of accelerator layer 168, including connections to inter-layer bus segments 200, and with each supernode being allocated respective accelerator blocks, including a pattern matching block 216, XML processing block 218, cryptography block 220 and compression/decompression block 222. Each supernode also includes associated bus interface logic (PBIC) blocks 224 to interface the respective accelerator blocks with the inter-layer bus.

Figure 11:
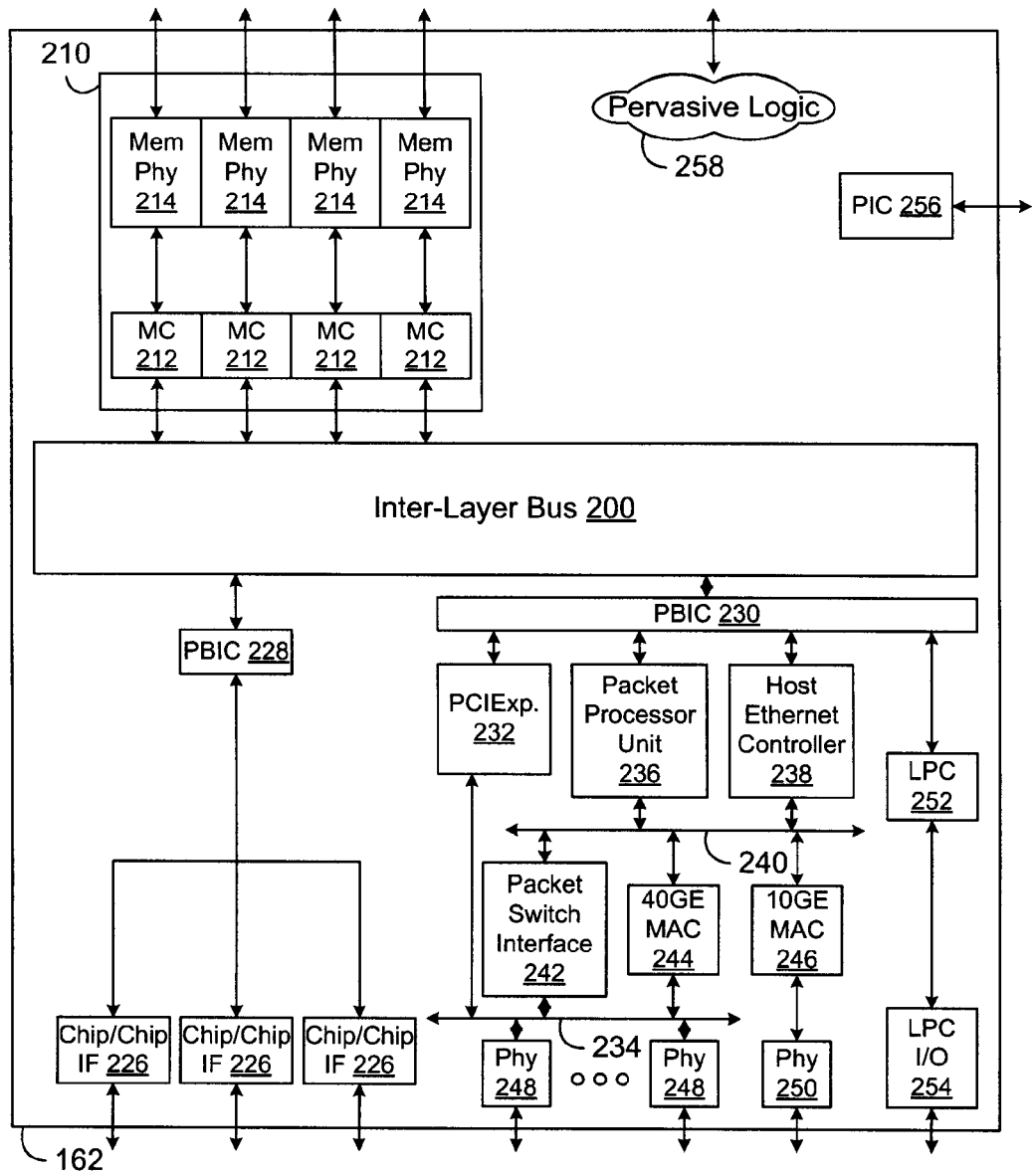
FIG. 11 is a block diagram of an I/O circuit layer from the multi-layer semiconductor stack of FIG. 8.

FIG. 11 illustrates one suitable implementation of I/O layer 162, including a portion of inter-layer bus 200 that additionally includes one or more intra-layer buses to interconnect the four inter-layer bus segments and thereby allow each supernode to access the functional units on I/O layer 162, as well as to communicate with one another.

As noted above, an inter-layer bus consistent with the invention may be implemented in a number of manners. Typically, an inter-layer bus will include both functional signal paths associated with the communication of data over the bus, as well as additional support or pervasive signal paths, including, for example, power distribution signal paths, clock distribution signal paths, testing/debugging signal paths, interrupt signal paths, reset signal paths, etc. The functional signal paths may implement any number of bus implementations, including those implementing separate command, address and data signal paths, or those in which command, address and/or data is communicated over the same signal paths. Various bus or network architectures, e.g., point-to-point, switched, multi-drop, etc., may also be implemented, and control logic may be utilized in the architecture to partition the inter-layer bus into multiple segments so that all functional units coupled to the bus are not required to share the same bandwidth. While the term "bus" is utilized herein, it will be appreciated that an inter-layer bus may include practically any networking architecture that enables multiple logical units in a circuit design to communicate with one another, and that an inter-layer bus architecture may include various buffers, controllers, switches, routers, etc. as may be required to implement the desired networking architecture. Furthermore, in some embodiments, circuit layers may be designated as source, termination and/or interior layers, with differing bus control logic implemented in each such layer to provide appropriate bus source and termination logic for a given bus architecture. It may be desirable, for example, to utilize one or more master bus controllers on I/O layer 162 to manage the communication of data over each bus segment.

The integration of pervasive signal paths into an inter-layer bus architecture provides an additional benefit in terms of distributing the pervasive logic of a circuit design throughout the multi-layer semiconductor stack, since the mere process of aligning the semiconductor dies into the stack and bonding them together not only forms the inter-layer bus, but also distributes the pervasive logic, including both clocking and test/debug logic, throughout the multiple circuit layers. Furthermore, an additional benefit is realized during manufacture since the standardized locations of the pervasive signal paths within the inter-layer interface region of each semiconductor die enables the individual semiconductor dies to be tested individually once the contact pads are formed on the dies, and moreover, once the semiconductor dies are bonded into the stack, the same contact pads on one of the exterior semiconductor dies can be used to perform additional global testing of the entire bonded stack.

In addition, an inter-layer bus may include portions that are intra-layer, e.g., to interconnect multiple bus segments that are topographically offset from one another in the stack. FIG. 12, for example, illustrates an exemplary multi-layer semiconductor stack 300 in which an inter-layer bus 302, including two inter-layer bus segments 302A and 302B, additionally includes an intra-layer bus segment 304 to enable functional units 306A coupled to inter-layer bus segment 302A to communicate with functional units 306B coupled to the other inter-layer bus segment 302B. In this implementation, networking logic may be utilized between each segment 302A, 302B and 304 to localize the bandwidth of each inter-layer segment 302A, 302B, and intra-layer segment 304 is used only to relay communications from one inter-layer bus segment 302A, 302B that are addressed to a functional unit on the other inter-layer bus segment 302A, 302B. In other embodiments, however, an inter-layer bus may be global where all functional units share the same bandwidth, or multiple inter-layer buses, which are completely isolated from one another, may be implemented in a given multi-layer semiconductor stack.

Another benefit of a standardized or universal inter-layer bus architecture is that the individual circuit layers and semiconductor dies within a given stack may be of different dimensions and/or compositions. For example, as shown in FIG. 13, a multi-layer semiconductor stack 310 consistent with the invention may include one or more semiconductor dies such as die 312 that are differently sized than other semiconductor dies 314, 316 in the stack. So long as the contact pads for the inter-layer bus are topographically aligned when the dies are bonded into a stack, the physical dimensions of the individual dies may be independent from one another.

As another example, as shown in FIG. 14, a multi-layer semiconductor stack 320 consistent with the invention may include one or more semiconductor dies such as die 322 that are designed and fabricated using different semiconductor fabrication design rules than other semiconductor dies 324, 326 in the stack. Die 322, in particular, is illustrated as being fabricated using a 45 nm process, while dies 324, 326 are illustrated as being fabricated using a 32 nm process. So long as the contact pads for the inter-layer bus are topographically aligned when the dies are bonded into a stack, the feature sizes for the logic circuits on each individual dies may be independent from one another. In addition, this configuration allows for the possibility that certain legacy layers may be reused with newer, more advanced layers. For example, in the circuit design of FIG. 8, a new, higher performance version of a compute layer, fabricated using a smaller feature size, may be substituted for a legacy compute layer, with the accelerator and I/O layers from the prior generation reused in the new multi-layer semiconductor stack.

Furthermore, the methodology described herein, wherein functional units having common functionality may be allocated to particular circuit layer, enables a substantial amount of flexibility in terms of design reuse. For example, the basic multi-layer design 160 described above in connection with FIGS. 8-11, which includes separate I/O, compute, and accelerator layers 162, 164/166, 168, could be used to implement an entire family of products simply by mixing and matching semiconductor dies for different functional layers in different semiconductor stacks. A common I/O layer 162 may be used as a starting point for all variations, including, for example:

low power—I/O layer, 1 compute layer low power+accelerator—I/O layer, 1 compute layer, 1 accelerator layer medium power—I/O layer, 2 compute layers medium power+accelerator—I/O layer, 2 compute layers, 1 accelerator layer high power—I/O layer, 3 compute layers high power+accelerator—I/O layer, 3 compute layers, 1 accelerator layer Also, by providing different accelerator layers, various types of specialized devices may be built from the same general purpose computing platform. For example, accelerator layers including appropriate acceleration hardware may be used to optimize a device for particular applications, e.g., networking, graphics processing, cryptography, etc. Likewise, different alternative layers having different power consumption characteristics may be used in different variations to enable the same platform to be used for both high performance/high power and low performance/low power applications. In addition, the techniques described herein may be used to provide different levels and/or sizes of cache memories for different variations so that, for example, applications requiring additional cache memory may utilize a larger cache memory implemented across several circuit layers, or multiple levels of cache.

The use of independent circuit layers may also provide the ability to utilize different types of circuits on different layers, e.g., to include FPGA's on certain layers. In addition, independent circuit layers may enable specialized circuitry requiring non-uniform characteristics to be isolated to a single layer, e.g., to account for off-chip drivers, varying voltages, passive or analog components, voltage regulation circuits. In some embodiments, specialized layers may be also be used solely for testing/debugging purposes or prototyping, which layers are then replaced by different operational layers once a particular design goes into production.

As noted above, another advantageous aspect of the configuration illustrated in FIGS. 8-11 is that of vertically slicing each circuit layer and utilizing multiple instances of the same logic on each circuit layer such that the individual instances form vertically-oriented supernodes that are interfaced with one another in the I/O layer, but that are otherwise independently operating units. The configuration of FIGS. 8-11 is effectively a collection of four independent processors, each including 16 processing cores, a dedicated L2 cache and a dedicated set of accelerators.

It is desirable in many embodiments, for example, to define multiple independently operating vertically-oriented supernodes that are functional duplicates of one another, e.g., to define multiple circuits that, from the standpoint of an external circuit interfacing with such circuits, operate in substantially the same manner as one another (e.g., analogous to integrating multiple processor chips into the same integrated circuit). Furthermore, in some embodiments, it is desirable for ease of design, fabrication and testing to implement the multiple supernodes using the same instances of functional units, e.g., so that for each circuit layer in which a functional unit is defined for one of the vertically-oriented supernodes, a corresponding instance of such functional unit is defined in such circuit layer for each of the plurality of vertically-oriented supernodes. Thus, for example, each compute layer 164, 166 is illustrated with eight instances of a compute node 204, with two such instances allocated to each vertically-oriented supernode, while accelerator layer 168 is illustrated with multiple instances of accelerator blocks, including a pattern matching blocks 216, XML processing blocks 218, cryptography blocks 220 and compression/decompression blocks 222, with separate instances allocated to each supernode. It will be appreciated that in some embodiments, functionally-identical instances allocated to different supernodes may also be identical from the standpoint of the circuit logic used to implement such instances, while in other embodiments, concerns such as optimizing the physical layout of a circuit design may necessitate that functionally-identical instances be implemented using non-identical underlying circuit logic.

Furthermore, due to the vertical orientation of the circuitry within each supernode, the supernode is more spatially compact than it would otherwise be if implemented on a single circuit layer, and less affected by signal propagation delays between the functional units within the supernodes. Assume, for example, that each node 204 in compute layers 164, 166 was implemented in a 7 mm×7 mm (7000 um×7000 um) area. Were two nodes that otherwise communicated through the inter-layer bus (assuming a 70 um layer thickness) laid out side-by-side on the same layer and forced to communicate intra-layer, the lengths of the signal paths would be at least an order of magnitude longer, and thus require a slower data transmission rate to account for the additional propagation delay that would be present in those signal paths. Likewise, for larger cache memories, orienting those cache memories in a separate layer may orient those memories closer to the processing logic than would otherwise occur if laid out side-to-side.

It will be appreciated that the circuit layer designs described herein may be implemented as generic gate netlists, or in other ways as may occur to those of skill in the art. A netlist is a Boolean-algebra representation (gates, standard cells) of an circuit's logical-function, analogous to an assembly-code listing for a high-level program application. Circuit layer designs also may be implemented, for example, in synthesizable form, described in a hardware description language such as Verilog or VHDL. In addition to netlist and synthesizable implementation, circuit layer designs also may be delivered in lower-level, physical descriptions. Analog elements such as SERDES, PLL, DAC, ADC, and so on, may be distributed in a transistor-layout format such as GDSII. Digital elements of circuit layer designs are sometimes offered in layout format as well. It will also be appreciated that circuit layer designs, as well as other logic circuitry implemented consistent with the invention may be distributed in the form of computer data files, e.g., logic definition program code, that define at various levels of detail the functionality and/or layout of the circuit arrangements implementing such logic. Thus, while the invention has and hereinafter will be described in the context of circuit arrangements implemented in fully functioning integrated circuit devices and stacked arrangements of such devices, data processing systems utilizing such devices, and other tangible, physical hardware circuits, those of ordinary skill in the art having the benefit of the instant disclosure will appreciate that the invention may also be implemented within a program product, and that the invention applies equally regardless of the particular type of computer readable or signal bearing media being used to distribute the program product. Examples of computer readable or signal bearing media include, but are not limited to, physical, recordable type media such as volatile and non-volatile memory devices, floppy disks, hard disk drives, CD-ROMs, and DVDs (among others), and transmission type media such as digital and analog communication links.

It will also be appreciated that the aforementioned design processes may be performed at least in part using computerized design and simulation tools. FIG. 15, for example, illustrates an apparatus 400 within which the various steps in a design process may be performed. Apparatus 400 in the illustrated embodiment is implemented as a server or multi-user computer that is coupled via a network 402 to one or more client computers 404. For the purposes of the invention, each computer 400, 404 may represent practically any type of computer, computer system or other programmable electronic device. Moreover, each computer 400, 404 may be implemented using one or more networked computers, e.g., in a cluster or other distributed computing system. In the alternative, computer 400 may be implemented within a single computer or other programmable electronic device, e.g., a desktop computer, a laptop computer, a handheld computer, a cell phone, a set top box, etc.

Computer 400 typically includes a central processing unit 406 including at least one microprocessor coupled to a memory 408, which may represent the random access memory (RAM) devices comprising the main storage of computer 400, as well as any supplemental levels of memory, e.g., cache memories, non-volatile or backup memories (e.g., programmable or flash memories), read-only memories, etc. In addition, memory 408 may be considered to include memory storage physically located elsewhere in computer 400, e.g., any cache memory in a processor in CPU 406, as well as any storage capacity used as a virtual memory, e.g., as stored on a mass storage device 410 or on another computer coupled to computer 400. Computer 400 also typically receives a number of inputs and outputs for communicating information externally. For interface with a user or operator, computer 400 typically includes a user interface 142 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 400 may also include one or more mass storage devices 410, e.g., a floppy or other removable disk drive, a hard disk drive, a direct access storage device (DASD), an optical drive (e.g., a CD drive, a DVD drive, etc.), and/or a tape drive, among others. Furthermore, computer 400 may include an interface 414 with one or more networks 402 (e.g., a LAN, a WAN, a wireless network, and/or the Internet, among others) to permit the communication of information with other computers and electronic devices. It should be appreciated that computer 400 typically includes suitable analog and/or digital interfaces between CPU 406 and each of components 408, 410, 412 and 414 as is well known in the art. Other hardware environments are contemplated within the context of the invention.

Computer 400 operates under the control of an operating system 416 and executes or otherwise relies upon various computer software applications, components, programs, objects, modules, data structures, etc., as will be described in greater detail below. For example, the processes described herein may be performed with the assistance of various design and simulation tools 418, which may receive as input, and generate as output, one or more circuit designs 420. In addition, as noted above, layer templates 422 may be used to facilitate the design of circuit layers incorporating features suitable for implementing a universal or standardized interlayer bus. Moreover, various applications, components, programs, objects, modules, etc. may also execute on one or more processors in another computer coupled to computer 400 via network 402, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while aspects of the invention has been described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution.

In addition, various program code described herein may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Thermal Vias

Embodiments of the invention are also directed to increasing the thermal conductivity of a multi-layer semiconductor stack. In particular, it has been found that, through the use of a multi-layer semiconductor stack, the semiconductor dies for individual circuit layers may be thinned to about ⅙ of the thickness of a normal semiconductor die, so that, for example, including inter-layer interconnections, a four layer chip stack may be constructed with approximately the same thickness as a normal single layer chip. It is believed that, to a first order, the thermal resistance per square millimeter of a four layer chip stack is similar to a normal single layer chip, however, given the four times increase in logic circuitry per square millimeter, the four layer chip stack presents an area to a heat sink that is only about ¼ that of a normal single layer chip, leading to a 4× increase in thermal density.

One technique for addressing the increase in thermal density relies on thermal-only through vias (also referred to herein as "thermal vias"), extending between the opposing faces of stacked semiconductor dies. The thermal vias are provided in addition to data-carrying through vias, which communicate data signals between circuit layers, and power-carrying through vias, which are coupled to a power distribution network for the circuit layers, such that the thermal conductivity is increased above that which may be provided by the data-carrying and power-carrying through vias in the stack.

Figure 16:
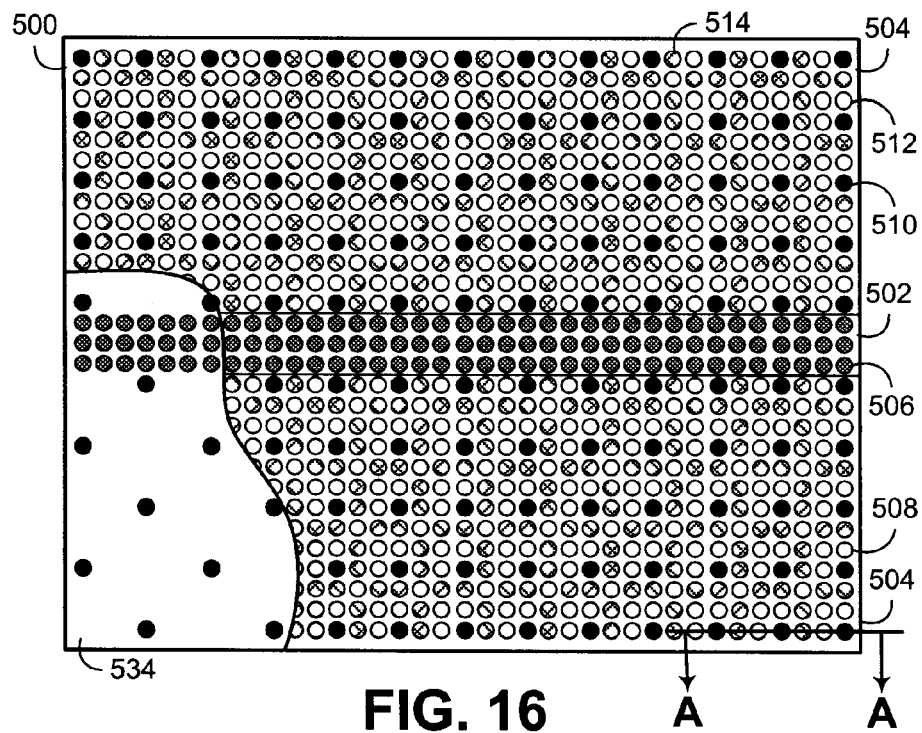
FIG. 16 is a functional top plan view of an exemplary multi-layer semiconductor stack incorporating thermal vias consistent with the invention, with portions thereof cut away.

FIG. 16, for example, illustrates a rectangular array of contact pads 508 disposed over the surface of a semiconductor die 500. Similar to semiconductor die 12 of FIG. 3, semiconductor die 500 includes an inter-layer interface region 502 and a functional region 504, with gray pads 506 disposed within inter-layer interface region 502 and coupled to electrical conductors for the inter-layer bus, and black pads 510 operating as power distribution pads coupled to either positive voltage (VDD) or ground. The white pads 512 are dummy pads, and are electrically isolated from any active circuitry; however, such dummy pads also serve as additional mechanical connections to which adjacent semiconductor dies can be secured.

In addition, a portion of pads 508 may be designated as thermal only pads 514 (designated by cross-hatching), which are utilized to increase the thermal conductivity through the semiconductor die. Thermal only pads 514 are similar to dummy pads 512 in that the pads do not have any functional use on the device from the standpoint of data-carrying or power distribution. Unlike dummy pads 512, however, thermal only pads 514 include cooperative thermal only through vias extending between the opposing faces of semiconductor die 500.

Figure 17:
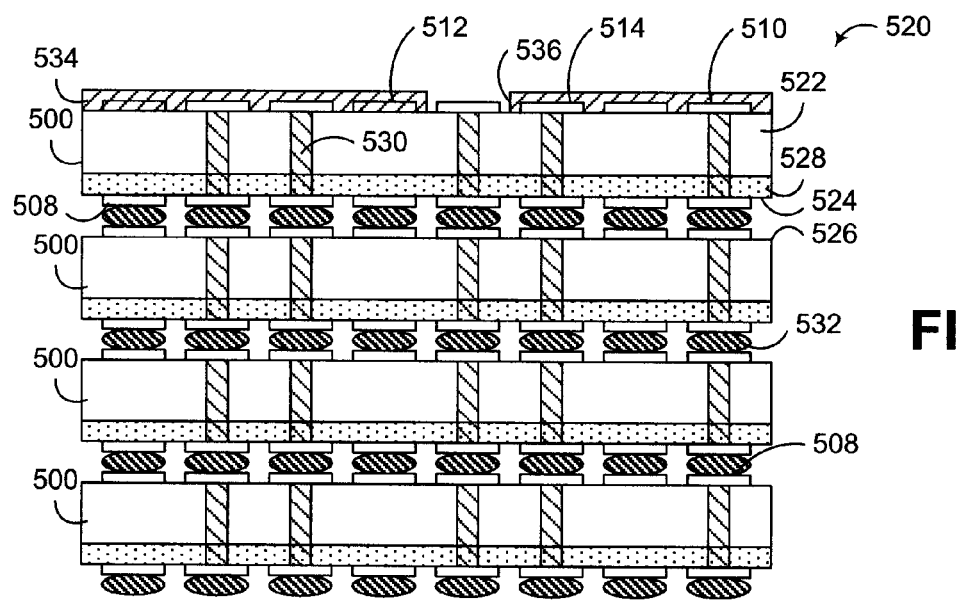
FIG. 17 is a functional cross-sectional view of the multi-layer semiconductor stack of FIG. 16, taken along lines A-A.

As illustrated in FIG. 17, which is a cross-sectional view taken through lines A-A of FIG. 16, a multi-layer semiconductor stack 520 includes four semiconductor dies 500 physically and electrically coupled to one another in a stack arrangement. Each die 500 includes a substrate 522 (e.g., a silicon substrate), and each die includes opposing surfaces or faces 524, 526, and at least one of which includes circuit logic 528 integrated thereon and defining a circuit layer for the multi-layer stack.

To physically and electrically couple the semiconductor dies 12 together, a regular array of pads 508 is formed on each surface 524, 526 after TSV's 530 are formed at each topographic location corresponding to a data-carrying pad 506 (none shown in FIG. 17), power distribution pad 510 and thermal only pad 514. Notably, in this embodiment, TSV's are not formed in the topographic locations corresponding to dummy pads 512. Once the contact pads are formed on the opposing surfaces of the semiconductor dies 500, the dies 500 may be physically and electrically coupled to one another in a stacked arrangement using any of a number of different types of chip bonding techniques, e.g., compression soldering or micro C4 (Controlled Collapse Chip Connection), resulting in the formation of a regular array of physical/electrical interconnects 532 joining contact pads 508 on adjacent surfaces 524, 526 of adjacent semiconductor chips 500.

In addition, in some embodiments it may be desirable to further enhance the thermal conductivity of the chip stack by forming a backside thermal conductive layer 534 (FIGS. 16 and 17), formed of metal or another thermally conductive material, on the backside of the chip stack. Typically, the backside thermal conductive layer 534 is electrically coupled to thermal only pads 514 and ground-type power distribution pads 510. As such, it is desirable to etch around, and electrically isolate, power-type power distribution pads 510 and data-carrying pads 506 from the backside thermal conductive layer 534. Layer 534 improves thermal conductivity across the back side of stack 520, and improves thermal conductivity to a heat sink (not shown) when mounted to stack 520 during operation.

Returning to FIG. 16, it will be appreciated that the number and distribution of thermal only pads and vias may vary in different embodiments. For example, as shown in FIG. 16, the locations of half of the dummy pads and vias from the embodiment discussed above in connection with FIG. 3 may be allocated to thermal only pads and vias, resulting in each 3×3 grid of pads in functional region 504 including one power distribution pad 510, four dummy pads 512 and four thermal only pads 514.

In some embodiments, thermal only vias may be added to a design after initial floorplanning of the design based upon expected thermal conductivity needs. In addition, in some embodiments, simulation of a design may be performed to identify hot spots in a design. It will be appreciated that the distribution of thermal only pads in a grid of pads may vary in different embodiments. Moreover, different grids may include different distributions and/or numbers of thermal only pads. In addition, the number and distribution of thermal only pads may be selected in some embodiments based upon the expected thermal generating characteristics of the functional circuitry in the device, e.g., so that greater numbers of thermal only vias are disposed in regions where greater amounts of heat are expected to be generated. Furthermore, thermal only pads may be disposed in the inter-layer interface region in some embodiments. Moreover, different layouts of thermal only vias may be used in different semiconductor dies in the same multi-layer semiconductor stack.

Other modifications will be apparent to one of ordinary skill in the art.

Circuit Layer Sequencing for Thermal Enhancement

Another technique that may be used in connection with, or in lieu of thermal only vias is circuit layer sequencing, in which semiconductor dies are arranged in a stack in such a manner that semiconductor dies having higher current density are disposed closer to a bottom face of the stack than those having lower current density.

In particular, when deciding a sequence of semiconductor dies in a multi-layer semiconductor stack, conventional design methodologies would suggest that semiconductor dies having the highest current density, and thus generating the most heat, should be disposed at the top of a stack (i.e., closest to the heat sink).

However, it has been found that in some embodiments, it is desirable to focus more on power distribution losses (IR drops) in order to provide maximum thermal efficiency in a multi-layer semiconductor stack. In particular, it has been found that semiconductor dies used in a multi-layer semiconductor stack have substantially better thermal characteristics than conventional single layer semiconductor dies. Semiconductor dies used in a stack typically must be thinned in order to allow TSV's to be formed, e.g., from about 900 microns to about 150 microns, and as a result, a four layer semiconductor stack has less substrate thickness than a conventional single layer semiconductor die. Semiconductor substrates such as silicon typically have very poor thermal conductivity, and as such, the reduced semiconductor thickness in a multi-layer stack is one factor in providing better thermal characteristics.

Furthermore, due to the use of large numbers of TSV's in each semiconductor die to provide for inter-layer power distribution and an inter-layer bus, each semiconductor die in a multi-layer semiconductor stack inherently includes a relatively large number of thermally conductive pathways extending through each semiconductor die, thereby further improving the thermal characteristics of a multi-layer semiconductor stack relative to a conventional single layer semiconductor die. The addition of thermal only vias in some embodiments also improves the thermal characteristics, and as such, it is believed that the sequencing of circuit layers in multi-layer semiconductor stacks consistent with the invention is not limited purely by current density.

Instead, embodiments of the invention may also consider other factors, such as power distribution losses, in determining the optimal sequence of circuit layers in a multi-layer semiconductor stack. For example, it has been found that power distribution losses tend to increase the farther a circuit layer is from the power source (i.e., the module/substrate pins/connections), partially due to the relatively higher resistance of TSV's as compared to intra-layer interconnects. As such, it has been found that in many embodiments, sequencing circuit layers so as to orient circuit layers with higher current densities closer to the bottom of a stack to minimize power distribution losses.

FIG. 18, for example, illustrates an exemplary stack 550 including a top face 552 and bottom face 554, with the bottom face typically including interconnects for connecting the stack to a substrate or module. Stack 550 includes four layers 556, 558, 560 and 562, with the layers arranged in order of increasing current density from top face 552 to bottom face 554.

In other embodiments, however, functional concerns may also be considered in connection with selecting an optimal sequence. For example, FIG. 19 illustrates an exemplary stack 570 including a top face 572 and bottom face 574, and four layers 576, 578, 580 and 582. In this design, however, layer 576 corresponds to an accelerator layer such as is described above in connection with accelerator layer 168 of FIG. 10, layers 578, 580 correspond to compute layers such as described above in connection with compute layer 164 of FIG. 9, and layer 582 corresponds to an I/O (interface) layer such as is described above in connection with I/O layer 162 of FIG. 11. In this design, due to functional requirements, it may be desirable to organize I/O layer 162 at the bottom-most position in the sequence given that this layer handles much of the off-stack communications for the stack. With respect to the other circuit layers, however, assuming for example, that compute layers 578 and 580 have higher current densities than accelerator layer 576, it may be desirable to organize these layers closer to the bottom face of the stack relative to accelerator layer 578.

FIG. 20 next illustrates one design methodology 600 that may be utilized to design a multi-layer semiconductor stack incorporating the herein-described sequencing. Starting in block 602, functional units for the design are allocated to various circuit layers. The functional units are then laid out onto the circuit layers in block 604, and interconnected with one another in block 606. Simulation is then performed on the individual circuit layers to determine the current densities of each layer in block 608. Then, in block 610, the circuit layers are sequenced based upon their respective current densities as determined via simulation, and further simulation and testing is performed on the design in block 612. Based upon the simulation and test of the design, it may be determined whether any rework of the design is required (block 614), e.g., due to unacceptable power distribution losses, thermal dissipation, or functional timing issues. If no rework is required, the design is complete. Otherwise, it may be necessary to resequence the layers and/or reallocate functional units to different layers (block 616). Further simulation and testing of the design may then occur (block 612) until no further rework is required.

Various modifications may be made without departing from the spirit and scope of the invention. Therefore, the invention lies in the claims hereinafter appended.

What is claimed is:
1. A circuit arrangement, comprising:
a plurality of semiconductor dies physically and electrically coupled to one another in a stack, each semiconductor die including opposing faces, wherein at least one face of each semiconductor die includes circuit logic integrated thereon and defining a circuit layer, and wherein each semiconductor die includes a semiconductor substrate; and
an array of conductive through vias disposed in each of the plurality of semiconductor dies, the array of conductive through vias in each semiconductor die extending through such semiconductor die, wherein a first subset of the conductive through vias are configured as data-carrying through vias that are coupled to the circuit layer on such semiconductor die to communicate data between the circuit layer on such semiconductor die and another circuit layer disposed on another semiconductor die in the stack, wherein a second subset of the conductive through vias are configured as power-carrying through vias that are coupled to a power distribution network for the circuit layer on such semiconductor die, wherein a third subset of the conductive through vias are configured as thermal-only through vias that are non-data-carrying and non-power-carrying and that conduct thermal energy generated by the circuit layers within the stack, and wherein the thermal-only through vias in each semiconductor die are electrically isolated from the power distribution network and any generated data signals for the circuit layer on such semiconductor die, extend between the opposing faces of such semiconductor die, and have higher thermal conductivity than the semiconductor substrate of such semiconductor die.
2. The circuit arrangement of claim 1, wherein the stack includes bottom and top opposing faces respectively defined on bottom and top semiconductor dies from among the plurality of semiconductor dies, wherein the bottom face is configured to mount the stack to a substrate, and wherein the top face includes a conductive layer deposited across at least a portion of the top face and electrically coupled to the thermal-only through vias in the top semiconductor die.

3. The circuit arrangement of claim 2, wherein the conductive layer is further electrically coupled to a plurality of ground power distribution through vias in the top semiconductor die.

4. The circuit arrangement of claim 1, wherein the circuit layer in each semiconductor die includes at least one functional unit, wherein at least one face of each semiconductor die includes an inter-layer interface region disposed thereon, wherein each inter-layer interface region on each semiconductor die is disposed at substantially the same topographic location when the respective semiconductor die is disposed within the stack, and wherein the circuit arrangement further comprises an inter-layer bus electrically coupling the functional units on the plurality of semiconductor dies to one another, the inter-layer bus comprising a plurality of electrical conductors disposed within the inter-layer interface region of each semiconductor die and extending between the opposing faces of each semiconductor die, wherein respective electrical conductors disposed in the inter-layer interface regions of adjacent semiconductor dies in the stack are electrically coupled to one another when the plurality of circuit layers are physically and electrically coupled to one another in the stack.

5. The circuit arrangement of claim 1, wherein each semiconductor die includes an array of contact pads disposed on at least one face of such semiconductor die and topographically aligned with the array of conductive through vias, wherein a first subset of the contact pads are configured as data-carrying contact pads that are electrically coupled to data-carrying through vias, wherein a second subset of the contact pads are configured as power-carrying contact pads that are electrically coupled to power-carrying through vias, and wherein a third subset of the contact pads are configured as thermal-only contact pads that are electrically coupled to thermal-only through vias.

6. The circuit arrangement of claim 5, wherein the array of contact pads disposed on each semiconductor die is a regular array, and wherein a fourth subset of the contact pads are dummy contact pads that are not topographically aligned with any of the conductive through vias.

7. The circuit arrangement of claim 6, wherein adjacent semiconductor dies in the stack are physically and electrically coupled to one another through a plurality of electrical conductors extending between topographically aligned contact pads on the adjacent semiconductor dies.

8. The circuit arrangement of claim 7, wherein the plurality of electrical conductors comprise a plurality of micro C4 interconnects.

9. A program product, comprising at least one hardware design file defining the plurality of circuit layers of claim 1, and a non-transitory computer readable storage medium storing the at least one hardware design file.

10. A multi-layer semiconductor stack comprising the plurality of semiconductor dies of claim 1.

11. A method of manufacturing a multi-layer circuit arrangement, the method comprising:
   forming a plurality of semiconductor dies physically and electrically coupled to one another in a stack, each semiconductor die including opposing faces, wherein at least one face of each semiconductor die includes circuit logic integrated thereon and defining a circuit layer, and wherein each semiconductor die includes a semiconductor substrate; and
   forming an array of conductive through vias on each of the plurality of semiconductor dies, the array of conductive through vias in each semiconductor die extending through such semiconductor die, wherein a first subset of the conductive through vias are configured as data-carrying through vias that are coupled to the circuit layer on such semiconductor die to communicate data between the circuit layer on such semiconductor die and another circuit layer disposed on another semiconductor die in the stack, wherein a second subset of the conductive through vias are configured as power-carrying through vias that are coupled to a power distribution network for the circuit layer on such semiconductor die, wherein a third subset of the conductive through vias are configured as thermal-only through vias that are non-data-carrying and non-power-carrying and that conduct thermal energy generated by the circuit layers within the stack, and wherein the thermal-only through vias in each semiconductor die are electrically isolated from the power distribution network and any generated data signals for the circuit layer on such semiconductor die, extend between the opposing faces of such semiconductor die, and have higher thermal conductivity than the semiconductor substrate of such semiconductor die.

12. A circuit arrangement, comprising:
   a plurality of semiconductor dies physically and electrically coupled to one another in a stack, each semiconductor die including opposing faces, wherein at least one face of each semiconductor die includes circuit logic integrated thereon and defining a circuit layer that includes at least one functional unit, wherein at least one face of each semiconductor die includes an inter-layer interface region disposed thereon, and wherein each inter-layer interface region on each semiconductor die is disposed at substantially the same topographic location when the respective semiconductor die is disposed within the stack; and
   an inter-layer bus electrically coupling the functional units on the plurality of semiconductor dies to one another, the inter-layer bus comprising a plurality of electrical conductors disposed within the inter-layer interface region of each semiconductor die and extending between the opposing faces of each semiconductor die, wherein respective electrical conductors disposed in the inter-layer interface regions of adjacent semiconductor dies in the stack are electrically coupled to one another when the plurality of circuit layers are physically and electrically coupled to one another in the stack;
wherein the stack includes bottom and top opposing faces respectively defined on bottom and top semiconductor dies from among the plurality of semiconductor dies, wherein the bottom face is configured to mount the stack to a substrate, and wherein the top face is configured to interface with a heat sink, wherein the plurality of semiconductor dies includes a first semiconductor die having a first current density and a second semiconductor die having a second current density that is lower than the first current density, and wherein the plurality of semiconductor dies are arranged in the stack such that the first semiconductor die, having a higher current density than the second semiconductor die, is disposed closer to the bottom face of the stack than the second semiconductor die to reduce a vertical distance from the circuit layer defined on the first semiconductor die to the bottom face of the stack and thereby reduce power distribution losses in the stack.

13. The circuit arrangement of claim 12, wherein the plurality of semiconductor dies are arranged in the stack in order of increasing current density from the top face of the stack to the bottom face of the stack.

14. The circuit arrangement of claim 12, wherein the plurality of semiconductor dies are arranged in the stack such that an interface circuit layer among the plurality of circuit layers is disposed closest to the bottom face of the stack, and such that each other circuit layer among the plurality of circuit layers is arranged in the stack in order of decreasing current density from the bottom face of the stack to the top face of the stack.

15. A multi-layer semiconductor stack comprising the plurality of semiconductor dies of claim 12.

16. A computer-implemented method of designing a multi-layer circuit arrangement, the method comprising:
   allocating each of a plurality of functional units in the circuit arrangement to one of a plurality of circuit layers;
   in response to user input, laying out each functional unit on the respective circuit layer to which such functional unit is allocated, wherein each circuit layer defines circuit logic configured to be integrated onto a semiconductor die, and wherein each circuit layer includes an inter-layer interface region disposed at a predefined topographic location thereon such that the inter-layer interface regions on the plurality of circuit layers are disposed at substantially the same topographic location when the respective semiconductor dies are physically and electrically coupled to one another in a stack, and wherein each inter-layer interface region includes a plurality of signal paths that are configured to define an inter-layer bus that electrically interconnects the plurality of circuit layers to one another when the respective semiconductor dies are physically and electrically coupled to one another in the stack, wherein the stack includes bottom and top opposing faces respectively defined on bottom and top semiconductor dies from among the plurality of semiconductor dies, wherein the bottom face is configured to mount the stack to a substrate, and wherein the top face is configured to interface with a heat sink, wherein the plurality of semiconductor dies includes a first semiconductor die having a first current density and a second semiconductor die having a second current density that is lower than the first current density;
   in response to user input, interconnecting each functional unit to at least a subset of the plurality of signal paths in the inter-layer interface region of the circuit layer allocated thereto; and
   organizing the plurality of circuit layers such that the plurality of semiconductor dies upon which those circuit layers are disposed are arranged in the stack such that the first semiconductor die, having a higher current density than the second semiconductor die, is disposed closer to the bottom face of the stack than the second semiconductor die to reduce a vertical distance from the circuit layer defined on the first semiconductor die to the bottom face of the stack and thereby reduce power distribution losses in the stack.

17. The method of claim 16, wherein organizing the plurality of circuit layers includes organizing the plurality of circuit layers in order of increasing current density from the top face of the stack to the bottom face of the stack.

18. The method of claim 16, wherein organizing the plurality of circuit layers includes organizing the plurality of circuit layers with an interface circuit layer disposed closest to the bottom face of the stack and each other circuit layer in order of decreasing current density from the bottom face of the stack to the top face of the stack.

* * * * *